(12) United States Patent
Aritome et al.

(10) Patent No.: US 9,286,988 B2
(45) Date of Patent: Mar. 15, 2016

(54) NONVOLATILE MEMORY DEVICE AND OPERATING METHOD THEREOF

(71) Applicant: SK hynix Inc., Gyeonggi-do (KR)

(72) Inventors: Seiichi Aritome, Gyeonggi-do (KR); Hyun-Seung Yoo, Gyeonggi-do (KR); Sung-Jin Whang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/673,321

(22) Filed: Mar. 30, 2015

(65) Prior Publication Data

US 2015/0206591 A1 Jul. 23, 2015

Related U.S. Application Data

(62) Division of application No. 13/398,397, filed on Feb. 16, 2012, now Pat. No. 9,019,767.

(30) Foreign Application Priority Data

Feb. 17, 2011 (KR) .......................... 10-2011-0014094
Jul. 18, 2011 (KR) .......................... 10-2011-0070880

(51) Int. Cl.
G11C 11/34 (2006.01)
G11C 16/14 (2006.01)
G11C 16/04 (2006.01)
H01L 27/115 (2006.01)

(52) U.S. Cl.
CPC ............ *G11C 16/14* (2013.01); *G11C 16/0408* (2013.01); *H01L 27/11556* (2013.01); *H01L 27/11582* (2013.01)

(58) Field of Classification Search
CPC ............. G11C 16/045; G11C 16/0433; G11C 16/0483
USPC ................................ 365/185.17, 185.05, 174
See application file for complete search history.

Primary Examiner — Han Yang
(74) Attorney, Agent, or Firm — IP & T Group LLP

(57) ABSTRACT

A nonvolatile memory device includes a channel vertically extending from a substrate, a plurality of memory cells stacked along the channel; a source region connected to a first end portion of the channel, and a bit line connected to a second end portion of the channel, wherein the first end portion of the channel that adjoins the source region is formed as an undoped semiconductor layer or a semiconductor layer doped with P-type impurities.

5 Claims, 24 Drawing Sheets

NONVOLATILE MEMORY DEVICE AND OPERATING METHOD THEREOF

CROSS-REFERENCE TO RELATED APPLICATIONS

This application is a division of U.S. patent application Ser. No. 13/398,397 filed on Feb. 16, 2012, which claims priority of Korean Patent Application Nos. 10-2011-0014094 and 10-2011-0070880, filed on Feb. 17, 2011, and Jul. 18, 2011, respectively. The disclosures of each of the foregoing application are incorporated herein by reference in its entirety.

BACKGROUND

1. Field

Exemplary embodiments of the present invention relate to a semiconductor device, and more particularly, to a nonvolatile memory device with a three-dimensional structure and a method for operating the same.

2. Description of the Related Art

A nonvolatile memory device retains stored data even when power is interrupted. Two-dimensional (2D) memory devices fabricated in a single layer on a silicon substrate have limitations in improving integration density. Therefore, 3D nonvolatile memory devices with memory cells stacked vertically from a silicon substrate have been proposed.

In general, in a nonvolatile memory device, a program/erase operation is performed using an F-N (Fowler-Nordheim) tunneling phenomenon. The F-N tunneling involves electrons that move through a tunnel dielectric layer between a floating gate and a channel by inducing a high potential difference between the floating gate and the channel. For example, a program operation is performed by transferring a program voltage (a high voltage) to a floating gate so that the electrons of a channel are implanted into the conductive band of the floating gate, and conversely, an erase operation is performed by transferring an erase voltage (a high voltage) to the channel so that the electrons implanted into the conductive band of the floating gate are discharged into the channel. In a nonvolatile memory device with a two-dimensional structure, an erase voltage is applied to a bulk formed in a substrate to be transferred to a channel, and an erase operation is performed by a unit of a block.

However, unlike the nonvolatile memory device with a two-dimensional structure, in a nonvolatile memory device with a three-dimensional structure, the speed of the erase operation and boosting of the potential of a channel may decrease. In the nonvolatile memory device with a three-dimensional structure, applying an erase bias due to the structure of the nonvolatile memory device may be difficult. More specifically, in a conventional nonvolatile memory device with a two-dimensional structure, since respective memory cells are formed in a substrate, the erase operation can be performed by applying an erase bias to the bulk of the substrate. Conversely, in a nonvolatile memory device with a three-dimensional structure, since memory cells are stacked along a channel extending from a substrate to define the three-dimensional structure, an erase bias may be difficult to transfer to a channel for an erase operation.

Therefore, in the nonvolatile memory device with a three-dimensional structure, an erase operation may be performed using GIDL (gate induced drain leakage) current.

FIG. 1 is a view illustrating the generation of GIDL current. For illustration purposes, gates and drains are mainly illustrated.

When a gate-to-drain junction overlap exists, as indicated by the reference symbol 'O', if a high voltage is applied to a gate electrode, GIDL current is generated due to direct tunneling between the gate electrode and a drain region. For the smooth generation of this GIDL current, a doping formation including a doping density difference that abruptly changes at the junction of a GIDL current inducing portion may be included.

Such GIDL current is utilized in the erase operation of the nonvolatile memory device with a three-dimensional structure. In detail, the nonvolatile memory device with a three-dimensional structure includes a channel that extends vertically, a source selection transistor, a plurality of memory cells, which are vertically stacked along the channel, a drain selection transistor, which is vertically stacked along the channel, and a source line and a bit line, which are respectively connected to both ends of the channel. In particular, for the generation of GIDL current, high density N-type impurity doping regions are provided on both ends of the channel, more specifically, on the channel portion between the source selection transistor and the source line and/or on the channel portion between the drain selection transistor and the bit line. In this structure, if a high voltage is applied to the gate of the source selection transistor or the drain selection transistor, the GIDL current may be generated. The hot holes generated by the GIDL current are supplied to the channel and are used in an erase operation.

Nevertheless, in such an erase operation, since the rate of the hot holes generated by the GIDL current is low, the speed of the erase operation is low. Also, while optimizing the doping density of the N-type impurity doping regions formed on both ends of the channel may be useful to ensure the smooth generation of the GIDL current in the three-dimensional structure because the channel is formed using polysilicon with a high impurity diffusion speed, optimizing the doping density may be difficult.

SUMMARY

Embodiments of the present invention are directed to a nonvolatile memory device with a three-dimensional structure having improved erase operation characteristics and a method for operating the same.

In accordance with an embodiment of the present invention, a nonvolatile memory device includes a channel vertically extending from a substrate; a plurality of memory cells stacked along the channel; a source region connected to a first end portion of the channel; and a bit line connected to a second end portion of the channel, wherein the first end portion of the channel that adjoins the source region is formed as an undoped semiconductor layer or a semiconductor layer doped with P-type impurities.

In accordance with another embodiment of the present invention, a method for operating the nonvolatile memory device includes applying a negative erase voltage to a control gate electrode of a memory cell; and applying a first voltage higher than the negative erase voltage to a channel through a source region to erase charges stored in the memory cell through F-N tunneling.

In accordance with another embodiment of the present invention, a method for operating the nonvolatile memory device includes applying a positive erase voltage to a channel through a source region; and applying a second voltage lower than the positive erase voltage to a control gate electrode of the memory cell to erase charges stored in the memory cell through F-N tunneling type.

DETAILED DESCRIPTION

Figure 1:
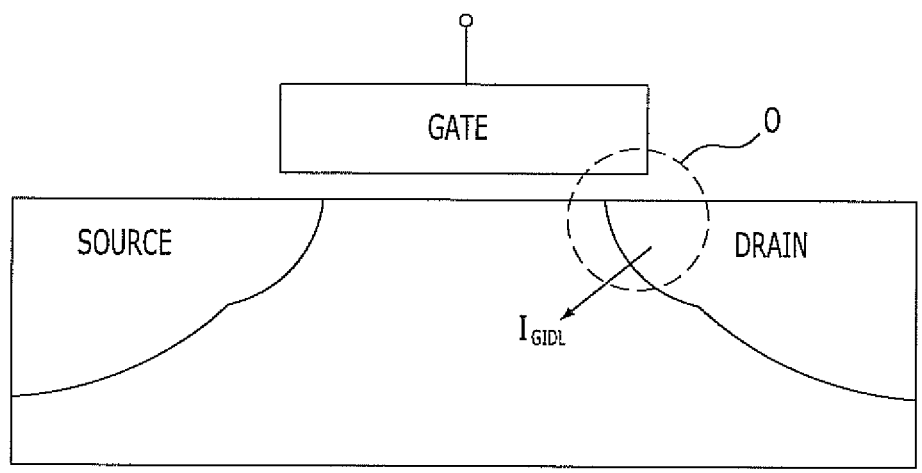
FIG. 1 is a view illustrating the generation of GIDL current.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
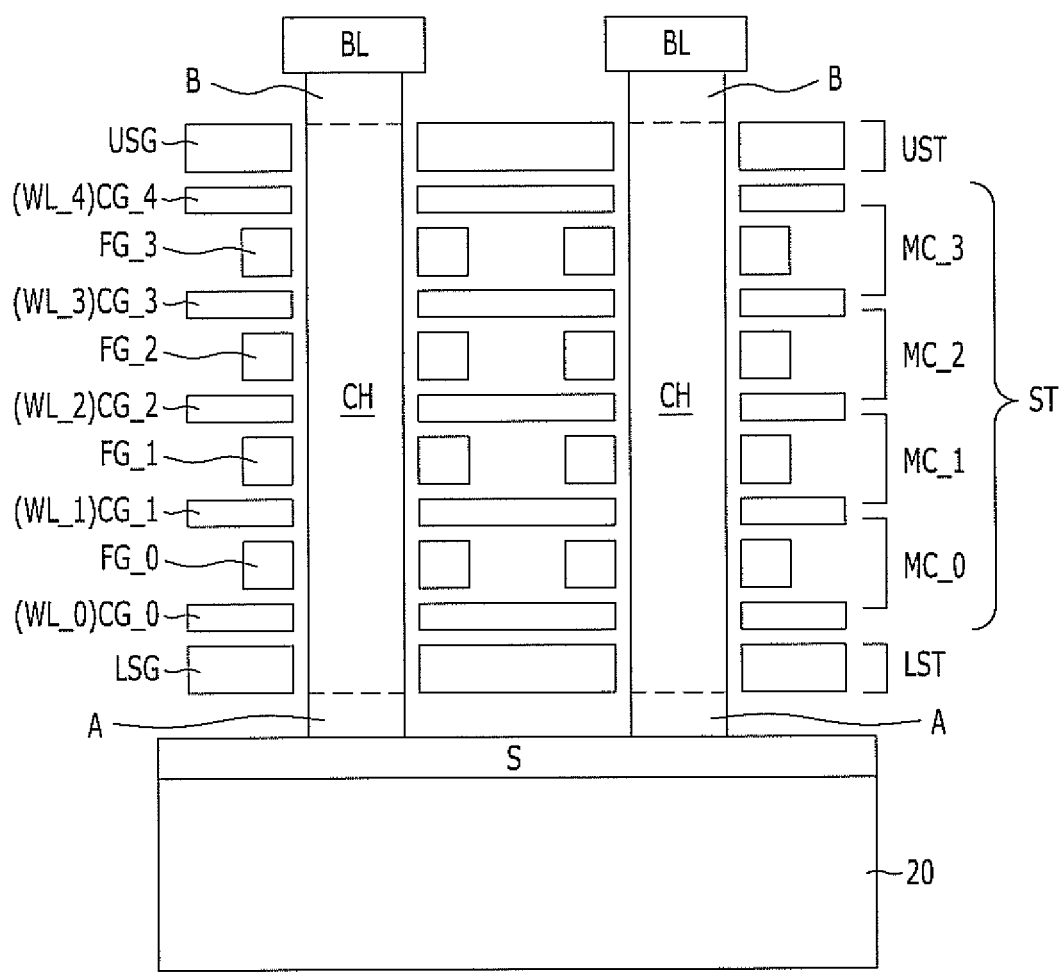
FIGS. 2A to 2C are views illustrating the configuration of a nonvolatile memory device with a three-dimensional structure in accordance with a first embodiment of the present invention.
Figure 2B:
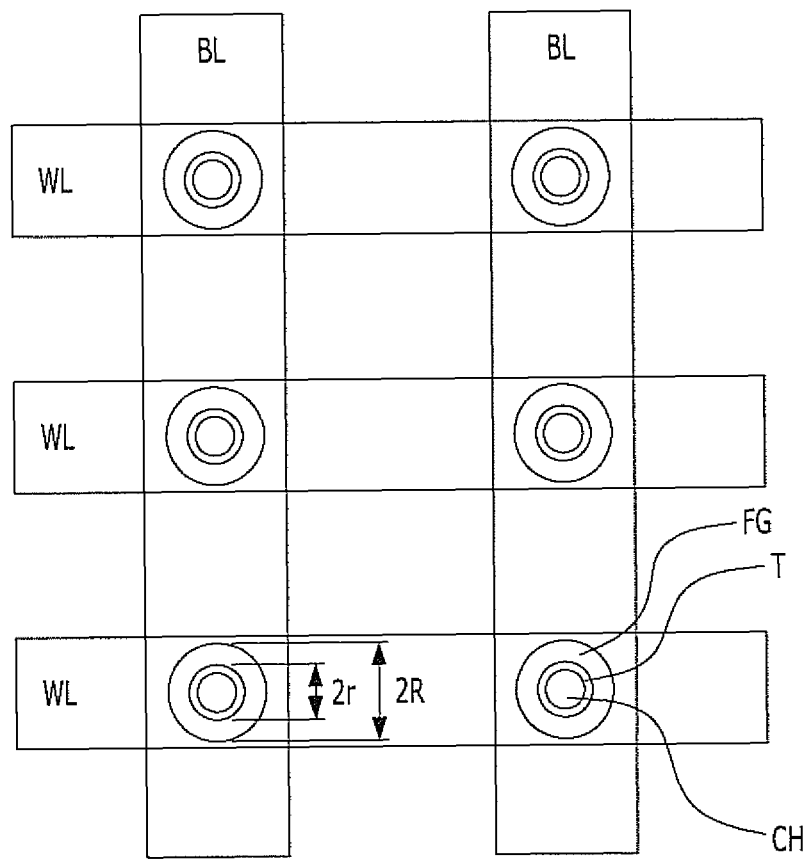
Figure 2C:
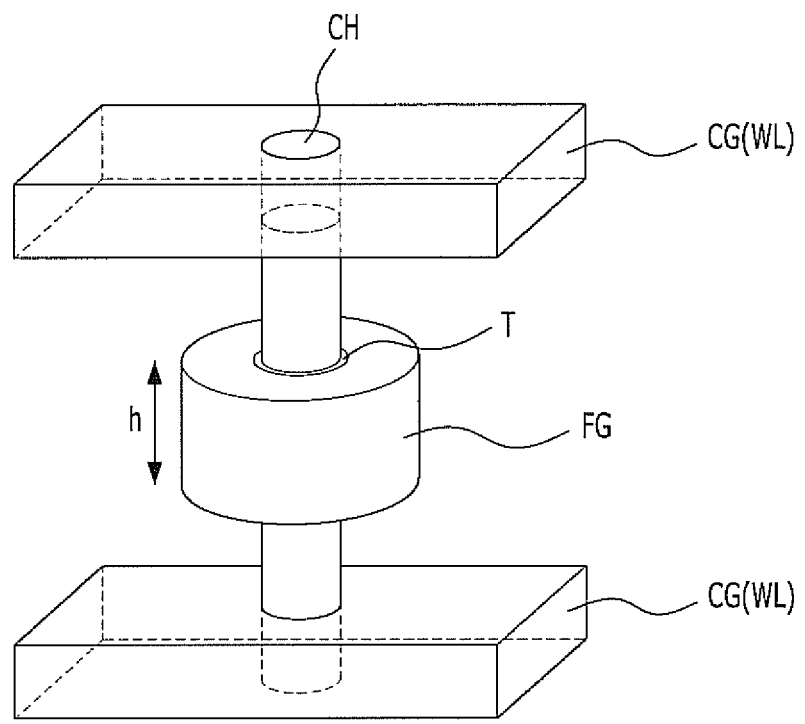

FIGS. 2A to 2C are views illustrating the configuration of a nonvolatile memory device with a three-dimensional structure in accordance with a first embodiment of the present invention, wherein FIG. 2A is a cross-sectional view, FIG. 2B is a plan view, and FIG. 2C is a perspective view illustrating a unit memory cell. For illustration purposes, channels, floating gate electrodes, and control gate electrodes are mainly illustrated, and dielectric layers interposed therebetween are omitted herein.

Referring to FIGS. 2A to 2C, the nonvolatile memory device with a three-dimensional structure in accordance with the first embodiment of the present invention includes a plurality of memory cells. $MC\_0$ to $MC\_3$, which are stacked along a channel CH vertically extending from a substrate 20 formed with a source region S. The plurality of memory cells $MC\_0$ to $MC\_3$ are connected in series between a lower selection transistor LST and an upper selection transistor UST and constitute one string ST. At first ends of a plurality of strings ST, which are arranged in a first direction, for example, a transverse direction, are connected to respective bit lines BL, and at second ends of the plurality of strings ST are commonly connected to the source region S. The plurality of strings ST may be arranged in a shape of a matrix. While FIG. 2A through FIG. 2C illustrate that one string ST includes four memory cells $MC\_0$ to $MC\_3$, the present invention is not limited to such and the number of memory cells may increase or decrease.

The upper selection transistor UST is disposed over the plurality of memory cells $MC\_0$ to $MC\_3$ and controls the electrical connection of the bit line BL and the string ST according to a voltage applied to an upper selection gate USG. The lower selection transistor LST is disposed under the plurality of memory cells $MC\_0$ to $MC\_3$ and controls the electrical connection of the source region S and the string ST according to a voltage applied to a low selection gate LSG.

As described above, the channel CH is used as the channel of the lower selection transistor LST, the plurality of memory cells $MC\_0$ to $MC\_3$, and the upper selection transistor UST. The lower end of the channel CH is connected to the source region S and the upper end of the channel CH is connected to the bit line BL. Here, a portion of the channel CH that corresponds to a region where the lower selection gate LSG, the plurality of memory cells $MC\_0$ to $MC\_3$, and the upper selection gate USG are formed will be referred to as an intermediate portion of the channel CH, and the remaining portions of the channel CH that are respectively adjacent to the source region S and the bit line BL will be referred to as a first end A and a second end B, respectively. The intermediate portion of the channel CH may be an undoped semiconductor layer or a semiconductor layer doped with low density P-type impurities, for example, a polysilicon layer. The first end A of the channel CH may have the same conductivity type as the intermediate portion of the channel CH, and accordingly, may be an undoped semiconductor layer or a semiconductor layer doped with low density P-type impurities, for example, a polysilicon layer. The second end B of the channel CH may have the same conductivity type as the intermediate portion of the channel CH or a different conductivity type from the intermediate portion of the channel CH. In other words, the second end B of the channel CH may be an undoped semiconductor layer or a semiconductor layer doped with low density P-type impurities, or the second end B of the channel CH may be a semiconductor layer doped with high density N-type impurities. Since the intermediate portion and the first end A of the channel CH have the same conductivity type, the channel CH directly contacts the source region S. In the embodiment where the second end B of the channel CH has the same conductivity type as the intermediate portion of the channel CH, the channel CH also directly contacts the bit line BL.

The memory cells $MC\_0$ to $MC\_3$ include a tunnel dielectric layer T, which surrounds the channel CH, a plurality of floating gate electrodes FG respectively formed around the tunnel dielectric layer T, and a plurality of control gate electrodes CG. The plurality of control gate electrodes and the plurality of floating gate electrodes FG are alternately stacked along the channel CH formed with the tunnel dielectric layer T. While the floating gate electrodes FG have the shapes of rings that surround the channel CH similarly to the tunnel dielectric layer T, the control gate electrodes CG extend in a direction crossing the bit line BL and form word lines WL. While not shown in FIGS. 2A through 2C, a charge blocking layer that prevents movement of the charges stored in the floating gate electrodes FG is interposed between the floating gate electrodes FG and the control gate electrodes CG.

Each of the memory cells MC_0 to MC_3 includes one floating gate electrode FG and two control gate electrodes CG, which are respectively formed over and under the floating gate electrode FG. For example, the second memory cell MC_1 includes a second floating gate electrode FG_1, a third control gate electrode CG_2, which is formed over the second floating gate electrode and a second control gate electrode CG_1, which is formed under the second floating gate electrode FG_1. One control gate electrode CG included in any memory cell that is not adjacent to the first end A or the second end B is shared by an adjoining memory cell. For example, the second memory cell MC_1 shares the second control gate electrode CG_1 with and the first memory cell MC_0 and shares a third control gate electrode CG_2 with the third memory cell MC_2.

When the nonvolatile memory device of the present invention is configured in accordance with the first embodiment as described above, the following effects are achieved.

First, since the channel directly contacts the source region or directly contacts the source region and the bit line, the potential of the channel is controlled by the voltage applied to the source region and/or the bit line. By controlling the potential of the channel, an F-N tunneling type erase may be performed. In the conventional art, high density N-type impurity regions are formed on both ends of a channel, and thus the channel does not directly contact a source region and a bit line. Because the channel does not directly contact a source region or a bit line, the potential of the channel increases when a high voltage is applied to a word line because of a channel boosting phenomenon, and thus, performing an erase operation may be difficult even though a high negative voltage is applied to the word line. However, in the present embodiment, since the potential of the channel is locked according to the voltage applied to the source region and/or the bit line because the channel directly contacts the source region and/or the bit line, an F-N tunneling erase may be implemented by applying a high negative voltage to a word line. Moreover, the voltage of the source region and/or the bit line may be directly transferred to the channel through the source region and/or the bit line, and an F-N tunneling erase may be performed by applying a high positive voltage to the channel. This operation will be described later in detail when explaining an operating method.

Second, since two control gate electrodes CG are provided over and under one floating gate electrode FG, a capacitance between the control gate electrodes CG and the floating gate electrode FG is calculated when calculating a coupling ratio as in the following Mathematical Expression 1.

[Mathematical Expression 1]
$$\text{Coupling Ratio}(CR) = \frac{2C_B}{2C_B + C_T}$$
$$C_B = \frac{\varepsilon S}{t_B} = \frac{\varepsilon * \pi * (R*R - r*r)}{t_B}$$
$$C_T = \frac{\varepsilon S}{t_T} = \frac{\varepsilon * 2r\pi * h}{t_T}$$

Here, $t_T$ denotes the thickness of the tunnel dielectric layer T, and $t_B$ denotes the thickness of the charge blocking layer. Also, h denotes the height of the floating gate electrode FG, r denotes the radius of the tunnel dielectric layer, R denotes the radius of the floating gate electrode FG, and S denotes an area.

For example, when $t_T$=8 nm, $t_B$=12 nm, h=60 nm, r=20 nm and R=50 nm, a coupling ratio becomes 0.538. Therefore, a coupling ratio may be increased, and accordingly, the performance of a memory device may be improved.

Next, a method for fabricating the above-described structure will be described below. FIGS. 3A to 3G are cross-sectional views illustrating the processes of a method for fabricating the nonvolatile memory device with a three-dimensional structure in accordance with the first embodiment of the present invention.

Figure 3A:
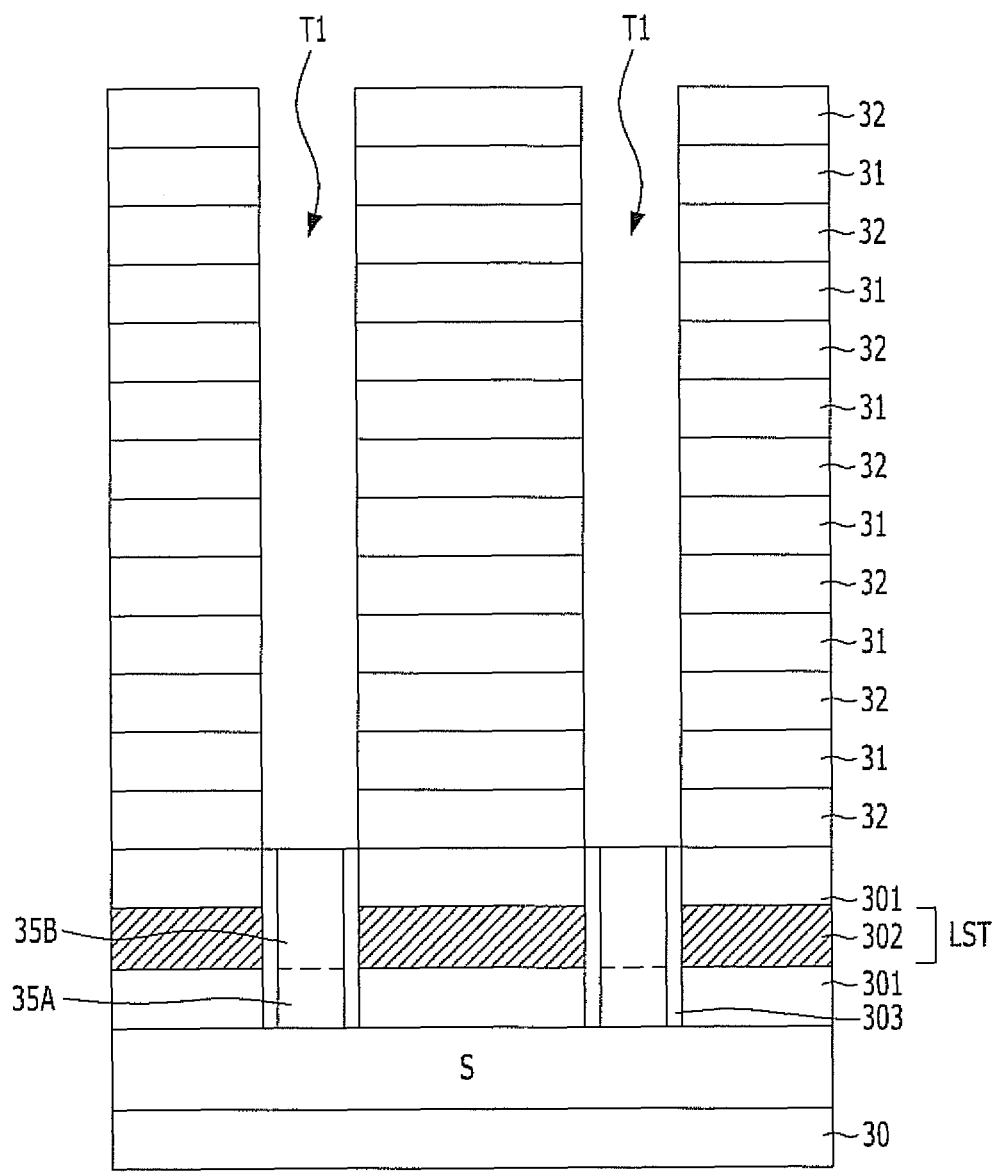
FIGS. 3A to 3G are cross-sectional views illustrating the processes of a method for fabricating the nonvolatile memory device with a three-dimensional structure in accordance with the first embodiment of the present invention.

Referring to FIG. 3A, a structure including lower selection transistors LST is formed on a substrate 30, which includes a source region S formed through doping of impurities.

In detail, a first interlayer dielectric layer 301, a first conductive layer 302, and another first interlayer dielectric layer 301 are sequentially formed on the substrate 30 formed with the source region S. Subsequently, holes for channels of the lower selection transistors LST are defined through the first interlayer dielectric layer 301, the first conductive layer 302, and the first interlayer dielectric layer 301 to expose the source region S. Subsequently, a gate dielectric layer 303 is formed on the sidewalls of the holes for channels, and channels 35A and 35B of the lower selection transistors LST are formed by filling a layer for channels. For illustration purposes, the channels 35A and 35B of the lower selection transistor LST are illustrated as being divided into a region 35A placed between the source region S and the first conductive layer 302 and a remaining region 35B. The region 35B substantially corresponds to the first end A of FIG. 2A. The layer for channels may be formed as an undoped semiconductor layer or a semiconductor layer doped with P-type impurities, for example, a polysilicon layer.

Next, a plurality of second interlayer dielectric layers 31 and a plurality of sacrificial layers 32 are alternately formed on the resultant structure that includes the lower selection transistors LST and the substrate 30.

The second interlayer dielectric layers 31 provide regions for forming floating gate electrodes through subsequent processes, and function to isolate control gate electrodes, which are to be formed over and under the floating gate electrodes, from one another. The sacrificial layers 32 secure spaces for forming a charge blocking layer and the control gate electrodes through subsequent processes.

The number of second interlayer dielectric layers 31 and sacrificial layers 32 may depend on the number of memory cells MC to be stacked on the substrate 30. Also, since the charge blocking layer and the control gate electrodes are formed in a subsequent process by selectively removing, for example, only the sacrificial layers 32, the sacrificial layers 32 may be formed of a substance that has a high etching selectivity with respect to the second interlayer dielectric layers 31. For example, each second interlayer dielectric layer 31 may be constituted by an oxide layer, such as an SiO2 layer, and each sacrificial layer 32 may be constituted by a carbon layer or a nitride layer, such as an SiN layer.

By etching the plurality of second interlayer dielectric layers 31 and the plurality of sacrificial layers 32, cell channel holes T1 are formed to expose the channels 35A and 35B of the lower selection transistors LST.

Figure 3B:
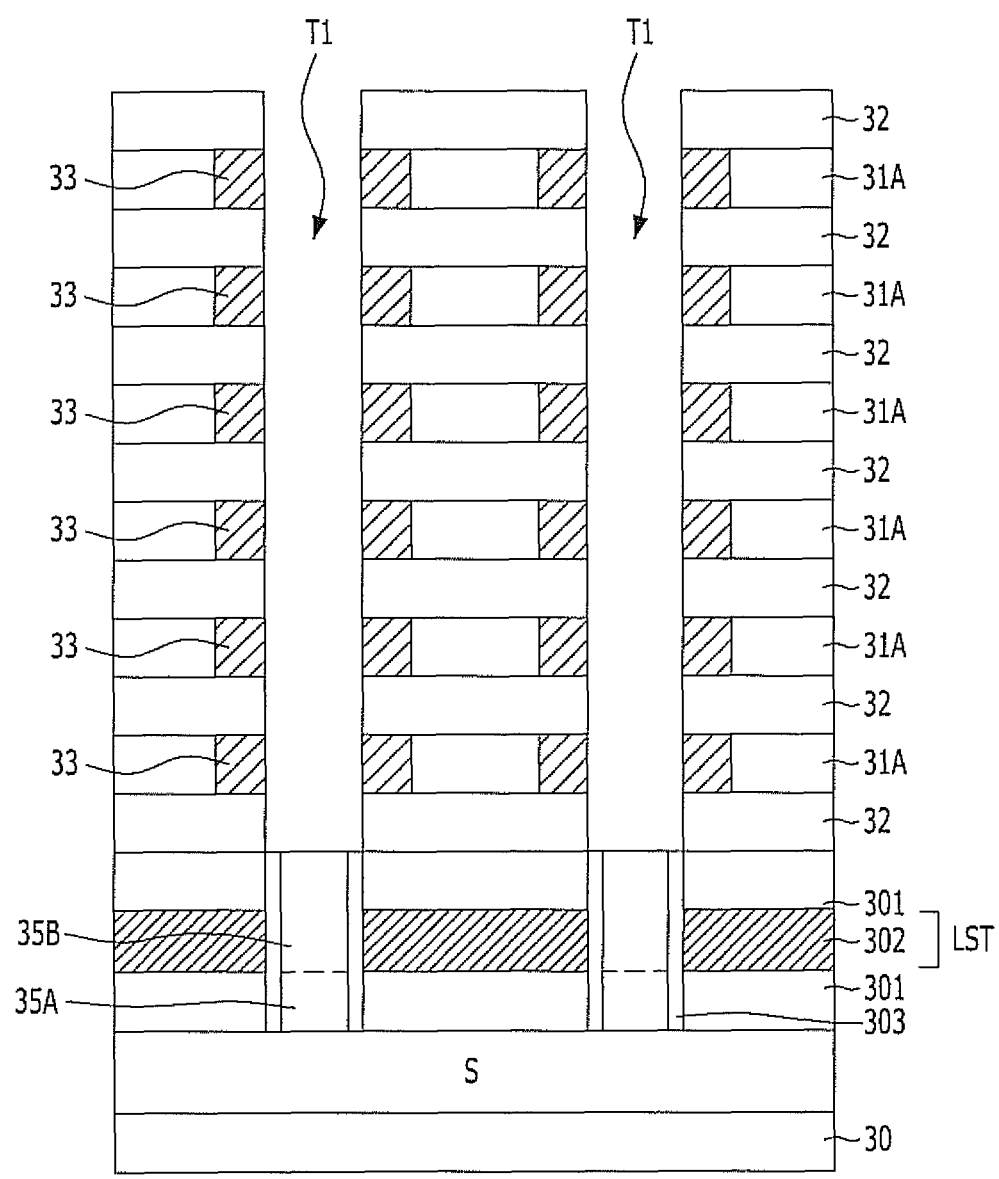

Referring to FIG. 3B, the plurality of second interlayer dielectric layers 31, which are exposed by the cell channel holes T1, are recessed by a designated thickness. The recessing thickness may depend on the thickness of the floating gate electrodes to be formed through a subsequent process. As shown in FIG. 3B, the second interlayer dielectric layers 31, which are recessed by the designated thickness, are designated by the reference number 31A.

The second interlayer dielectric layers 31 may be recessed through a wet etching process or an isotropic etching process.

Subsequently, floating gate electrodes 33 are formed by filling a conductive layer in the recessed regions of the second interlayer dielectric layers 31A. The floating gate electrodes 33 may be formed by filling the conductive layer in the cell channel holes T1 including the recessed regions and performing an etch-back process for the conductive layer.

Figure 3C:
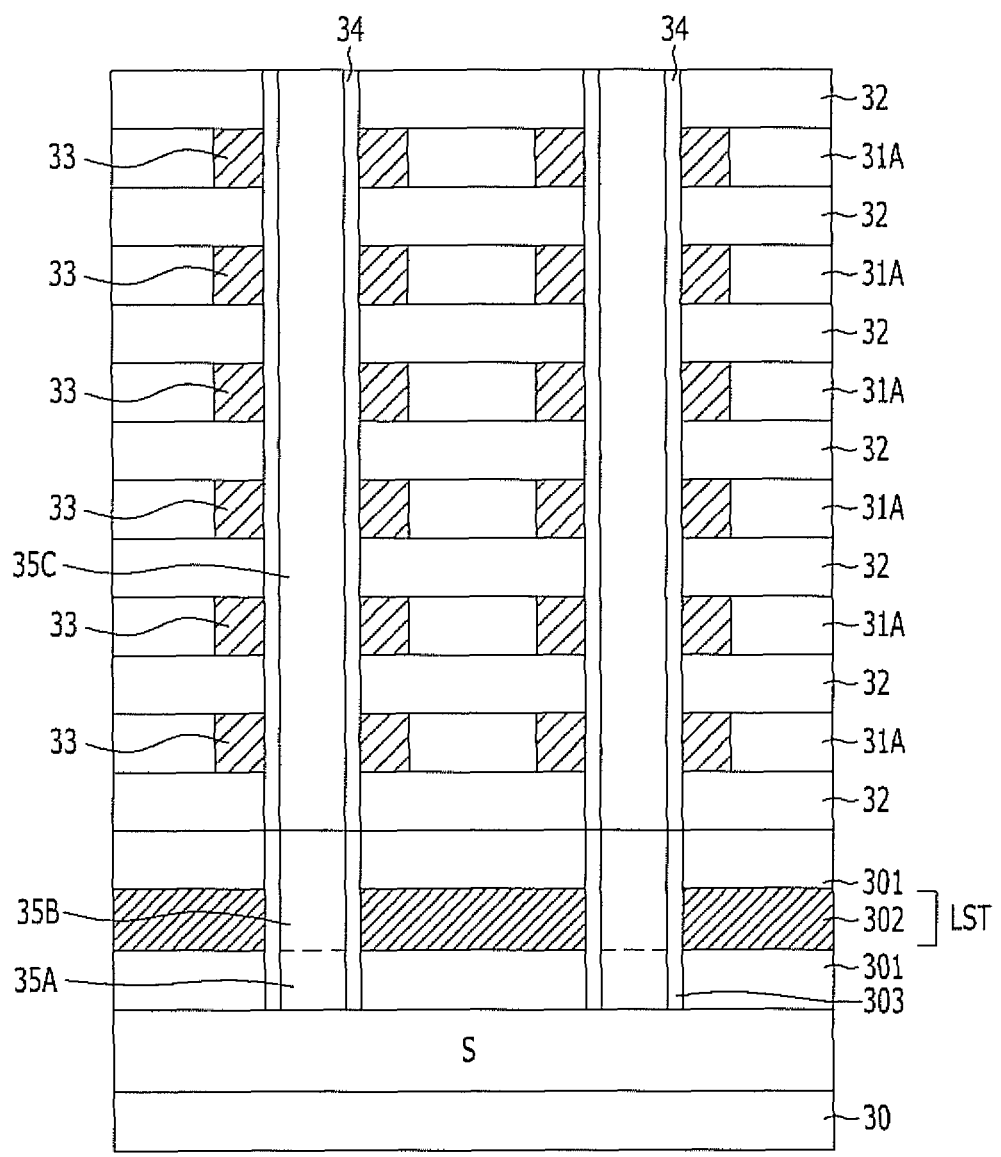

Referring to FIG. 3C, after forming a tunnel dielectric layer 34 on the sidewalls of the cell channel holes T1, channels 35C of the memory cells are formed by filling a layer for channels in the cell channel holes T1. The layer for channels may include a semiconductor layer with the same conductivity type as the channels 35A and 35B of the lower selection transistors LST, more specifically, an undoped semiconductor layer or a semiconductor layer doped with P-type impurities, for example, a polysilicon layer. If the channels 35C include a semiconductor layer with the same conductivity type as the channels 35A and 35B, the channels 35C of the memory cells are directly connected to the source region S via the channels 35A and 35B of the lower selection transistors LST.

While not shown in FIG. 3C, to prevent the tunnel dielectric layer 34 from being damaged, an oxide layer, a nitride layer, a carbon layer, or a polysilicon layer may be additionally formed on the tunnel dielectric layer 34 as a protective layer. For example, after forming the floating gate electrodes 33, a tunnel dielectric layer is formed on the entire surfaces of the cell channel holes T1. Subsequently, after forming a protective layer on the tunnel dielectric layer, the protective layer and the tunnel dielectric layer are etched back to expose the channels 35A and 35B of the lower selection transistors LST.

When forming the protective layer as described above, the protective layer may be removed before filling the layer for channels. When the protective layer is formed of the same substance as the layer for channels, the protective layer may not be removed.

Figure 3D:
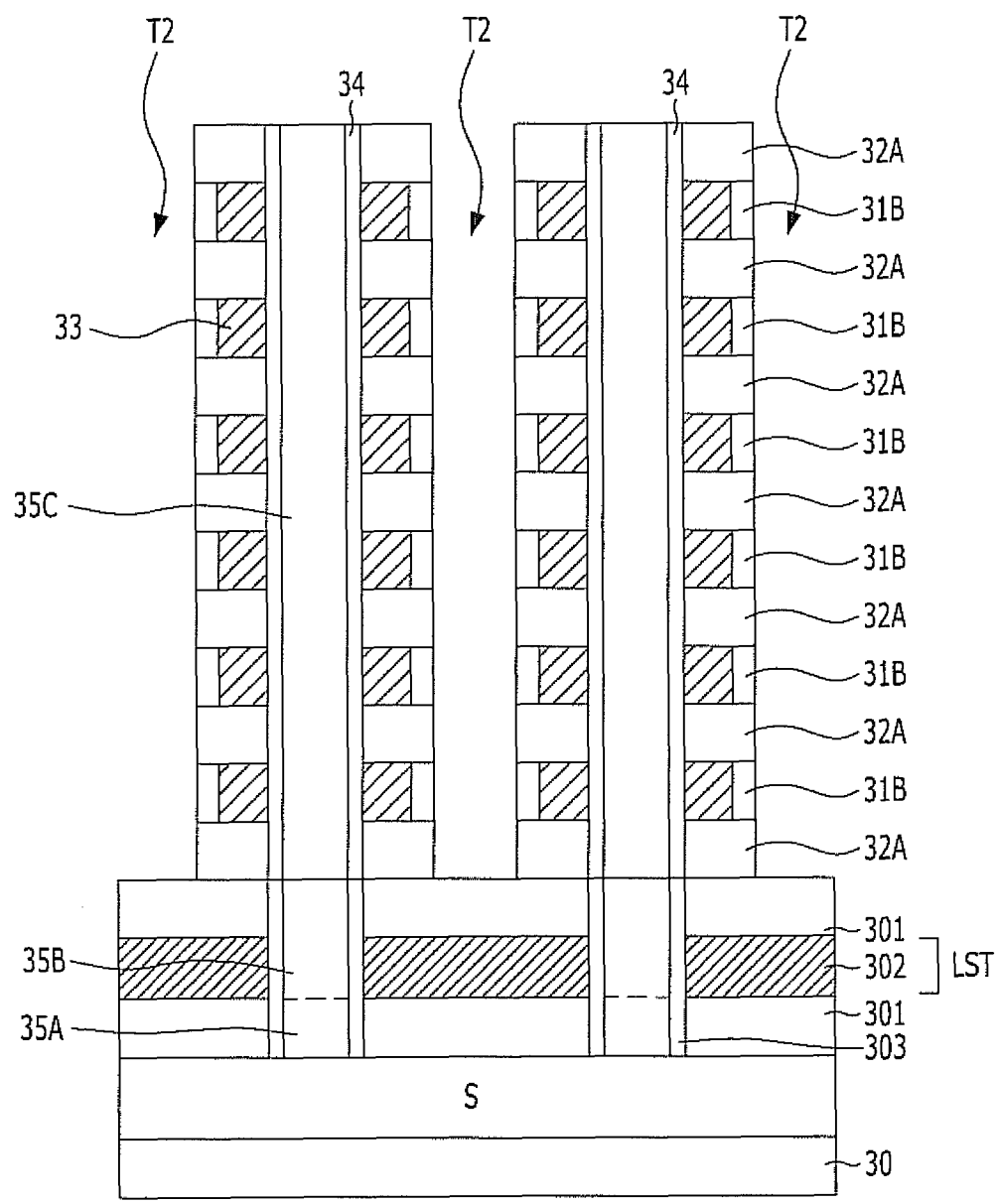

Referring to FIG. 3D, by selectively etching portions of the plurality of second interlayer dielectric layers 31A and the plurality of sacrificial layers 32 between the channels 35C of the memory cells, trenches T2 for removal of the sacrificial layers 32 are formed. As shown in FIG. 3D, the second interlayer dielectric layers 31A and the sacrificial layers 32, which are patterned to form the trenches T2, are designated by the reference numerals 31B and 32A, respectively.

Through the process for forming the trenches T2, the sacrificial layers 32A may be removed, and the control gate electrodes, more specifically, word lines, may be formed in subsequent processes. The trenches T2 may be formed to a depth capable of exposing all of the plurality of sacrificial layers 32 on the sidewalls of the trenches T2.

Figure 3E:
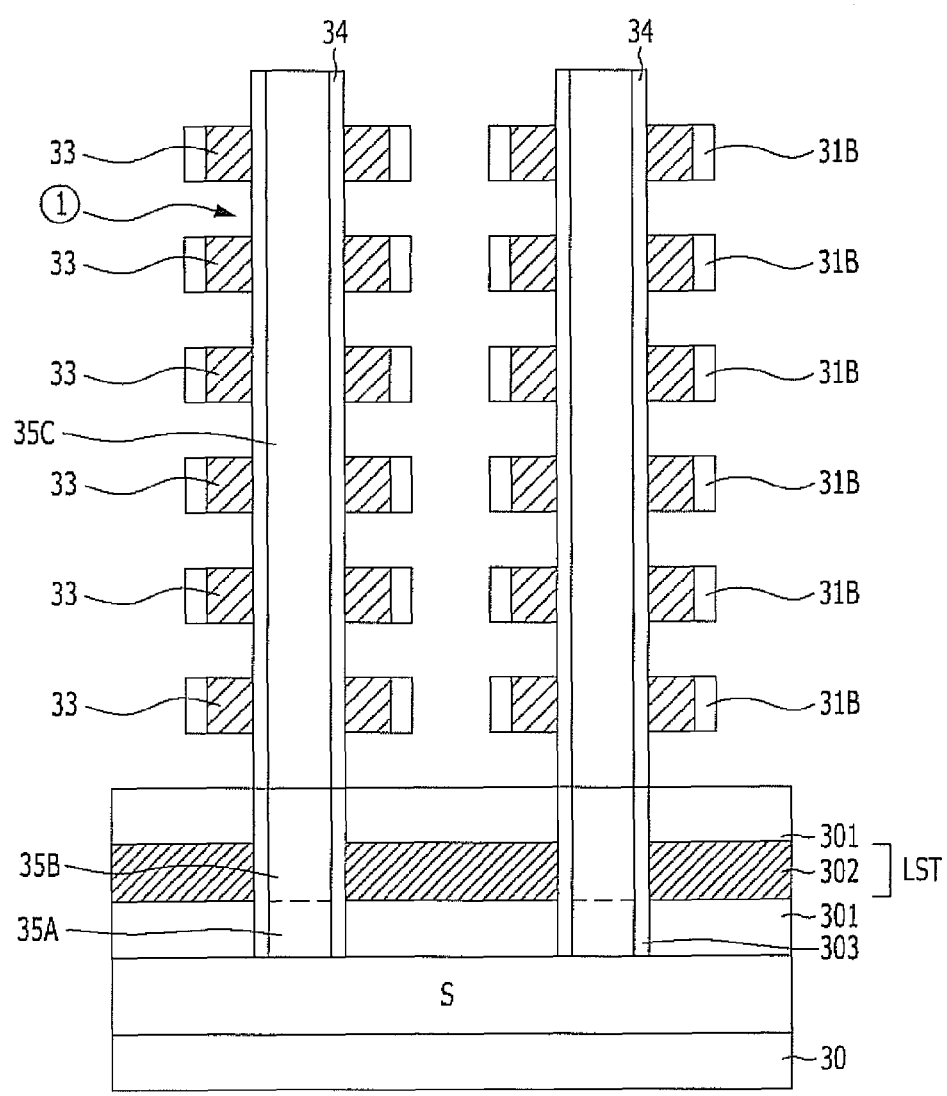

Referring to FIG. 3E, the sacrificial layers 32A exposed on the walls of the trenches T2 are removed, and regions for forming the charge blocking layer and the control gate electrodes are formed between the plurality of floating gate electrodes 33 (see the reference symbol ①).

Figure 3F:
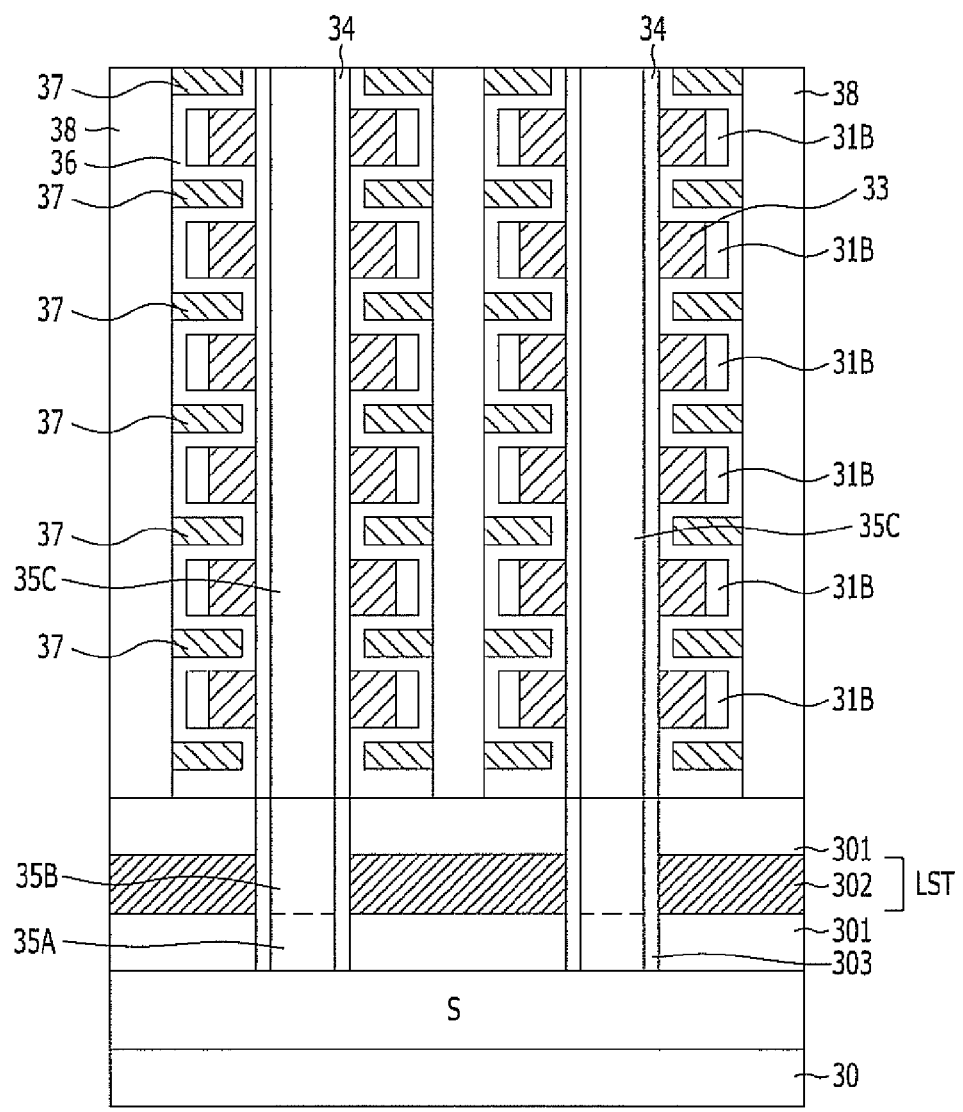

Referring to FIG. 3F, a charge blocking layer 36 is formed on the entire surface of the resultant structure after removing the sacrificial layers 32A. The charge blocking layer 36 covers the entire surfaces of the floating gate electrodes 33 excluding the surfaces facing the channels 35C, and by forming the charge blocking layer 36 in this way, interference between adjoining memory cells may be reduced.

In this way, the charge blocking layer 36 is formed in portions of the regions ①.

Next, by filling a conductive layer in the open regions ① between portions of the charge blocking layer 36, control gate electrodes 37 are formed.

The control gate electrodes 37 may be formed by filling the conductive layer in the trenches T2 including the open regions ① and performing an etch-back process for the conductive layer.

After the control gate electrodes 37 are formed, a dielectric layer 38 is filled in the remaining spaces between the control gate electrodes 37 and between portions of the charge blocking layer 36.

Figure 3G:
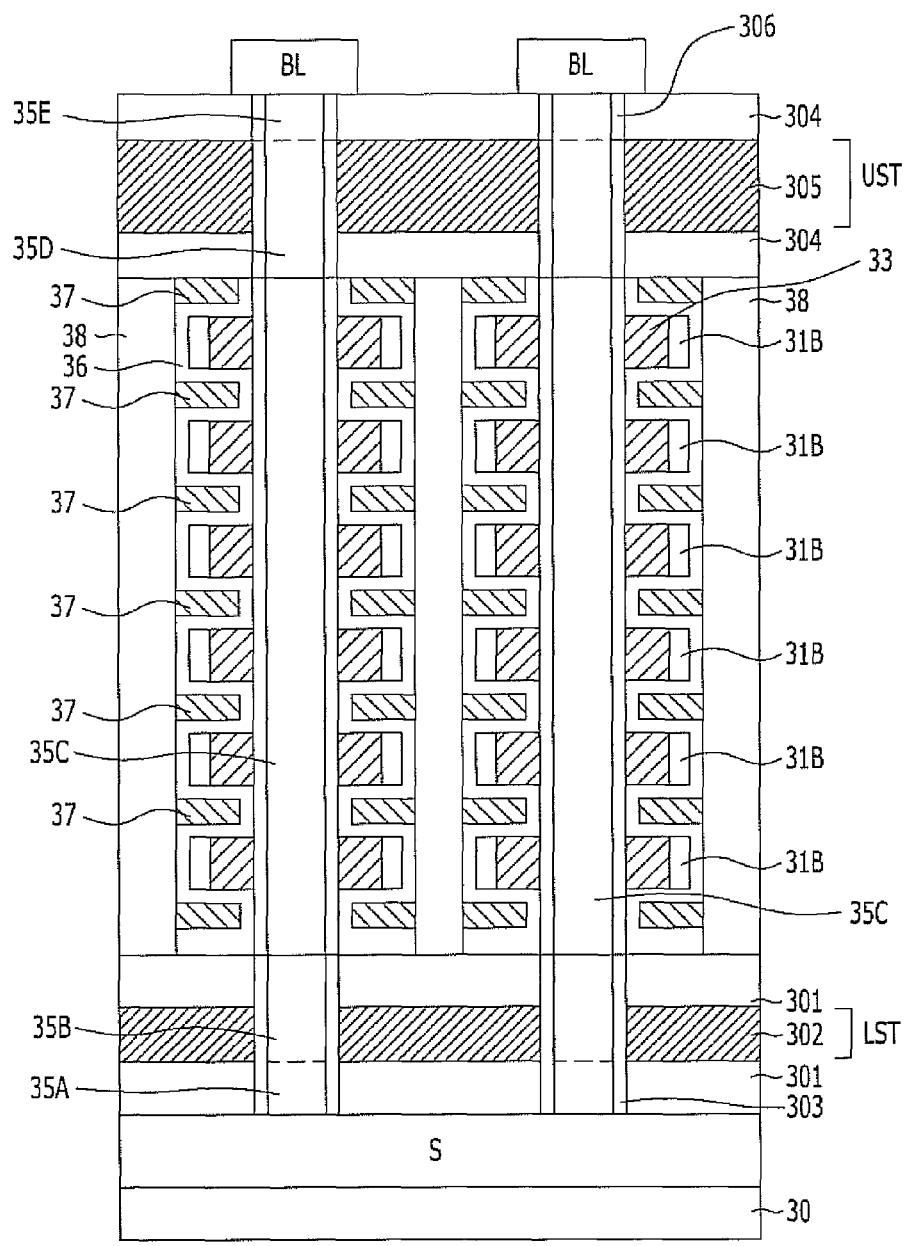

Referring to FIG. 3G, a structure including upper selection transistors UST is formed on the resultant structure of FIG. 3F.

In detail, a third interlayer dielectric layer 304, a second conductive layer 305, and another third interlayer dielectric layer 304 are sequentially formed on the resultant structure of FIG. 3F. Subsequently, holes for channels of the upper selection transistors UST are formed to expose the channels 35C of the memory cells. Subsequently, a gate dielectric layer 306 is formed on the sidewalls of the holes for channels, and channels 35D and 35E for the upper selection transistors UST are formed by filling a layer for channels. For illustration purposes, the channels 35D and 35E of the upper selection transistor UST are illustrated as being divided into a region 35E placed between a bit line BL and the second conductive layer 305 and a remaining region 35D. The region 35E substantially corresponds to the second end B of FIG. 2A. The layer for channels may be formed as an undoped semiconductor layer or a semiconductor layer doped with P-type impurities, for example, a polysilicon layer.

The region 35E may be doped with high density N-type impurities. Additionally, the region 35D of the upper selection transistors UST may be an undoped semiconductor layer or a semiconductor layer doped with P-type impurities, and the region 35E may be a semiconductor layer doped with N-type impurities. However, this process may be omitted, and if omitted, the channels 35D and 35E of the upper selection transistors UST are an undoped semiconductor layer or a semiconductor layer doped with P-type impurities.

By depositing and patterning a conductive layer on the resultant structure including the upper selection transistors UST, bit lines BL are formed, connected with the channels 35D and 35E of the upper selection transistors UST, and extended in a first direction.

According to the above-described embodiment of the present invention, a floating gate type nonvolatile memory device with a three-dimensional structure may be formed. In particular, because the control gate electrodes 37 are formed over and under the floating gate electrodes 33 by filling the conductive layer in the regions where the sacrificial layers 32A were removed, a memory cell including a floating gate electrode, which is driven by two control gate electrodes, may be formed.

Also, since the charge blocking layer 36 covers the entire surfaces of the floating gate electrodes 33, interference between memory cells may be reduced when compared to the conventional art.

FIGS. 4A to 4D are cross-sectional views illustrating the processes of another method for fabricating the nonvolatile memory device with a three-dimensional structure in accordance with the first embodiment of the present invention. For illustration purposes, descriptions to be repeated with respect to those given above may be omitted.

Figure 4A:
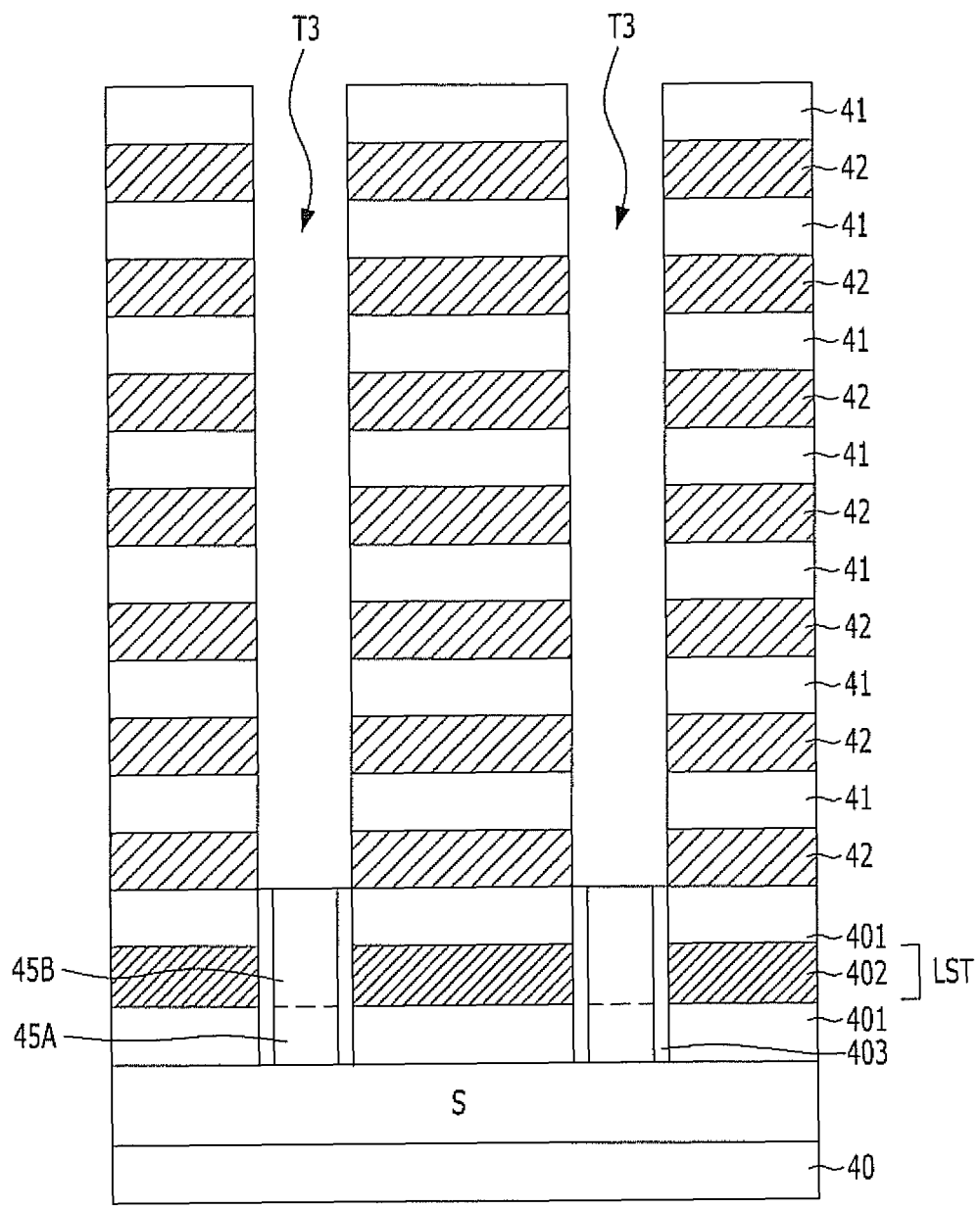
FIGS. 4A to 4D are cross-sectional views illustrating the processes of another method for fabricating the nonvolatile memory device with a three-dimensional structure in accordance with the first embodiment of the present invention.

Referring to FIG. 4A, a structure including lower selection transistors LST is formed on a substrate 40, which is formed with a source region S. A method for forming the lower selection transistors LST is substantially the same as described above. For illustration purposes, channels 45A and 45B of the lower selection transistor LST are illustrated by being divided into a region 45A placed between the source region S and a first conductive layer 402 and a remaining region 45B. The channels 45A and 45B of the lower selection transistors LST may be formed as an undoped semiconductor layer or a semiconductor layer doped with P-type impurities.

A plurality of second interlayer dielectric layers 41 and a plurality of second conductive layers 42 for control gate electrodes are alternately formed on the resultant structure that includes the lower selection transistors LST.

The second interlayer dielectric layers 41 provide regions for forming floating gate electrodes through subsequent processes, and function to isolate control gate electrodes, which are to be formed over and under the floating gate electrodes, from one another. The number of stacks of the second interlayer dielectric layers 41 and the second conductive layers 42 for control gate electrodes may depend on the number of memory cells MC to be stacked on the substrate 40.

The second interlayer dielectric layers 41 may be constituted by, for example, oxide layers. In this regard, since the second interlayer dielectric layer 41 placed uppermost of the stack serves as a hard mask layer, the uppermost second interlayer dielectric layer 41 may be formed of a substance with an etching rate different from that of the remaining second interlayer dielectric layers 41, for example, as a nitride layer.

Subsequently, cell channel holes T3 are formed by etching the plurality of second interlayer dielectric layers 41 and the plurality of second conductive layers 42 to expose the channels 45A and 45B of the lower selection transistors LST. The cell channel holes T3 may be formed to a depth capable of exposing all of the plurality of second interlayer dielectric layers 41 on the sidewalls of the cell channel holes T3.

Figure 4B:
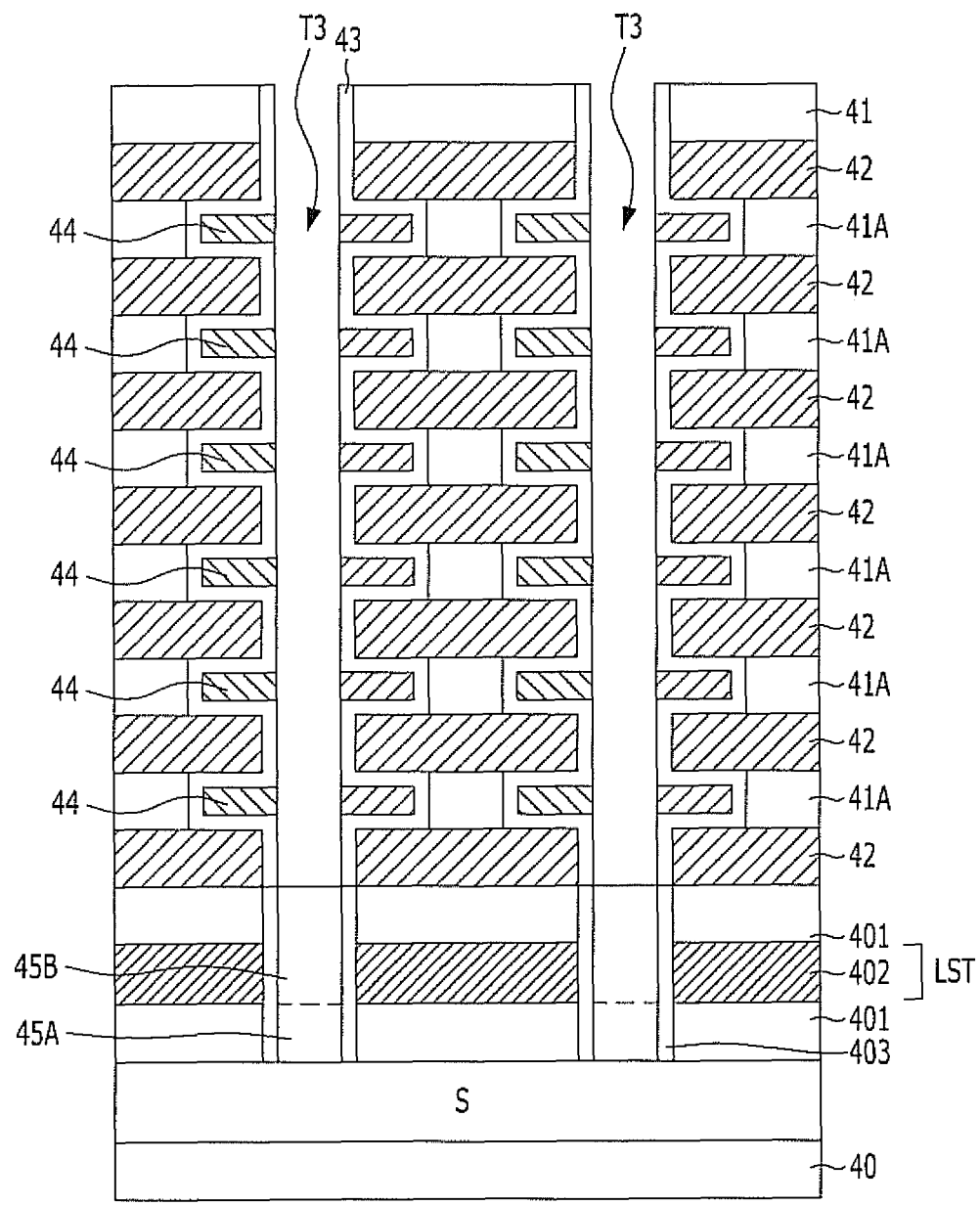

Referring to FIG. 4B, the plurality of second interlayer dielectric layers 41, which are exposed by the cell channel holes T3, are recessed by a designated thickness. The recessing thickness may depend on the thicknesses of a charge blocking layer and floating gate electrodes to be formed through subsequent processes. As a consequence, regions for forming the charge blocking layer and the floating gate electrodes through the subsequent processes are formed. As shown in FIG. 4B, the second interlayer dielectric layers 41, which are recessed by the designated thickness, are designated by the reference number 41A.

The second interlayer dielectric layers 41 may be recessed through a wet etching process or an isotropic etching process. When recessing the second interlayer dielectric layers 41A, the uppermost second interlayer dielectric layer 41 constituted by the nitride layer is not recessed.

Next, a charge blocking layer 43 is formed on the entire surface of the resultant structure including the recessed second interlayer dielectric layers 41A. In this way, the charge blocking layer 43 is formed in portions of the regions that are formed by recessing the second interlayer dielectric layers 41A.

Next, floating gate electrodes 44 are formed by filling a conductive layer in the open regions including the charge blocking layer 43 formed therein. The floating gate electrodes 44 may be formed by filling the conductive layer in the cell channel holes T3 including the open regions and performing an etch-back process for the conductive layer.

Therefore, the floating gate electrodes 44 are formed in such a manner that the entire surfaces of the floating gate electrodes 44 excluding the surfaces facing cell channels, which will be formed subsequently, are covered by the charge blocking layer 43.

Figure 4C:
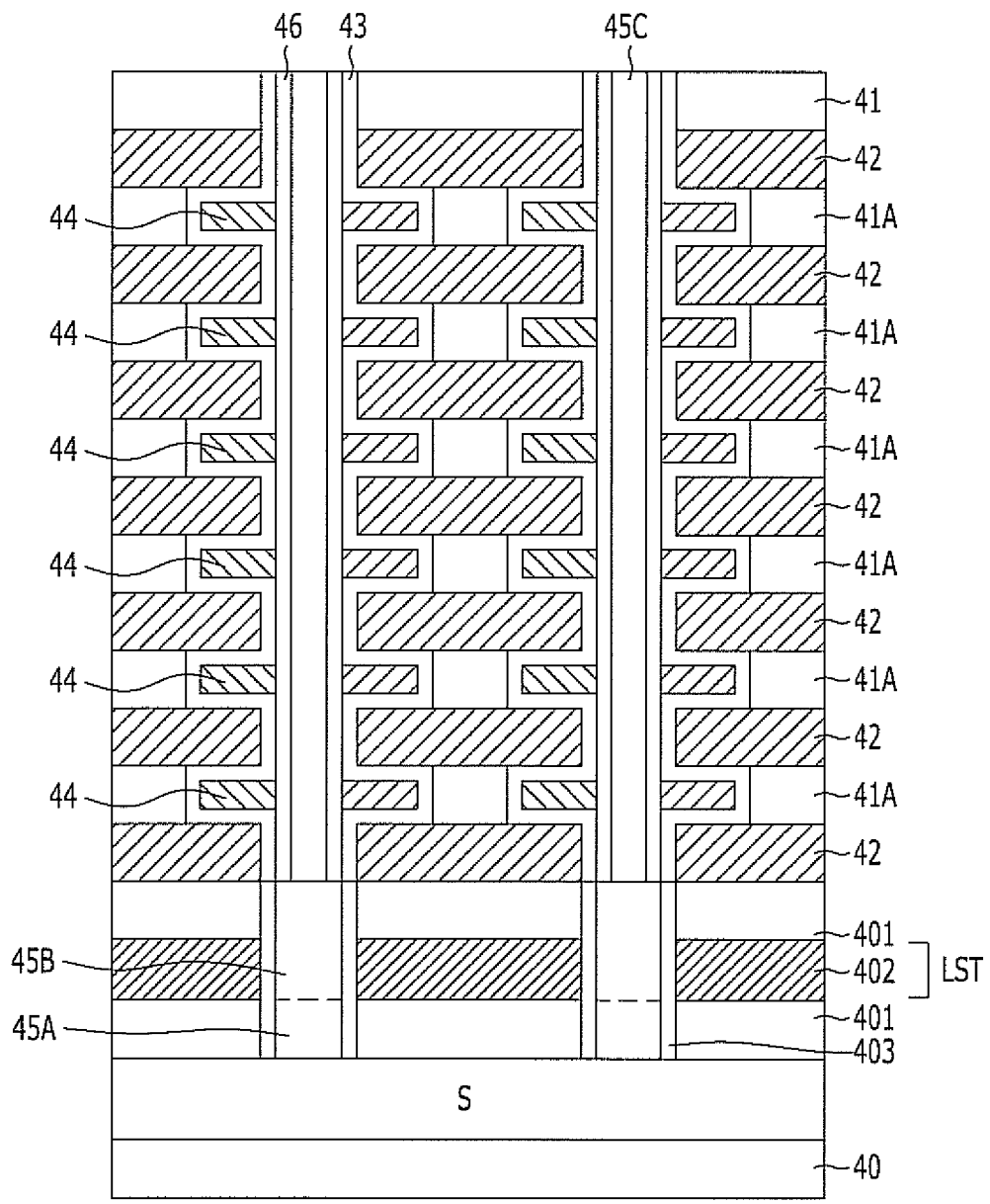

Referring to FIG. 4C, a tunnel dielectric layer 46 is formed on the sidewalls of the cell channel holes T3, and channels 45C are subsequently formed by filling a layer for channels in the cell channel holes T3. The layer for channels may be formed as a semiconductor layer with the same conductivity type as the channels 45A and 45B of the lower selection transistors LST, more specifically, an undoped semiconductor layer or a semiconductor layer doped with P-type impurities, for example, a polysilicon layer.

After forming the tunnel dielectric layer 46 on the entire surface of the resultant structure including the floating gate electrodes 44, the tunnel dielectric layer 46 on the bottoms of the cell channel holes T3 may be removed through an etch-back process. While not shown in FIG. 4C, to prevent the tunnel dielectric layer 46 from being damaged in the etch-back process, an oxide layer, a nitride layer, a carbon layer, or a polysilicon layer may be additionally formed on the tunnel dielectric layer 46 as a protective layer. For example, after forming the floating gate electrodes 44, a tunnel dielectric layer is formed on the entire surfaces of the cell channel holes T3. Subsequently, after forming a protective layer on the tunnel dielectric layer, the protective layer and the tunnel dielectric layer are etched back to expose the channels 45A and 45B of the lower selection transistors LST. When the protective layer is formed as described above, the protective layer may be removed before filling the layer for channels. When the protective layer is formed of the same substance as the layer for channels, the protective layer may not be removed.

Figure 4D:
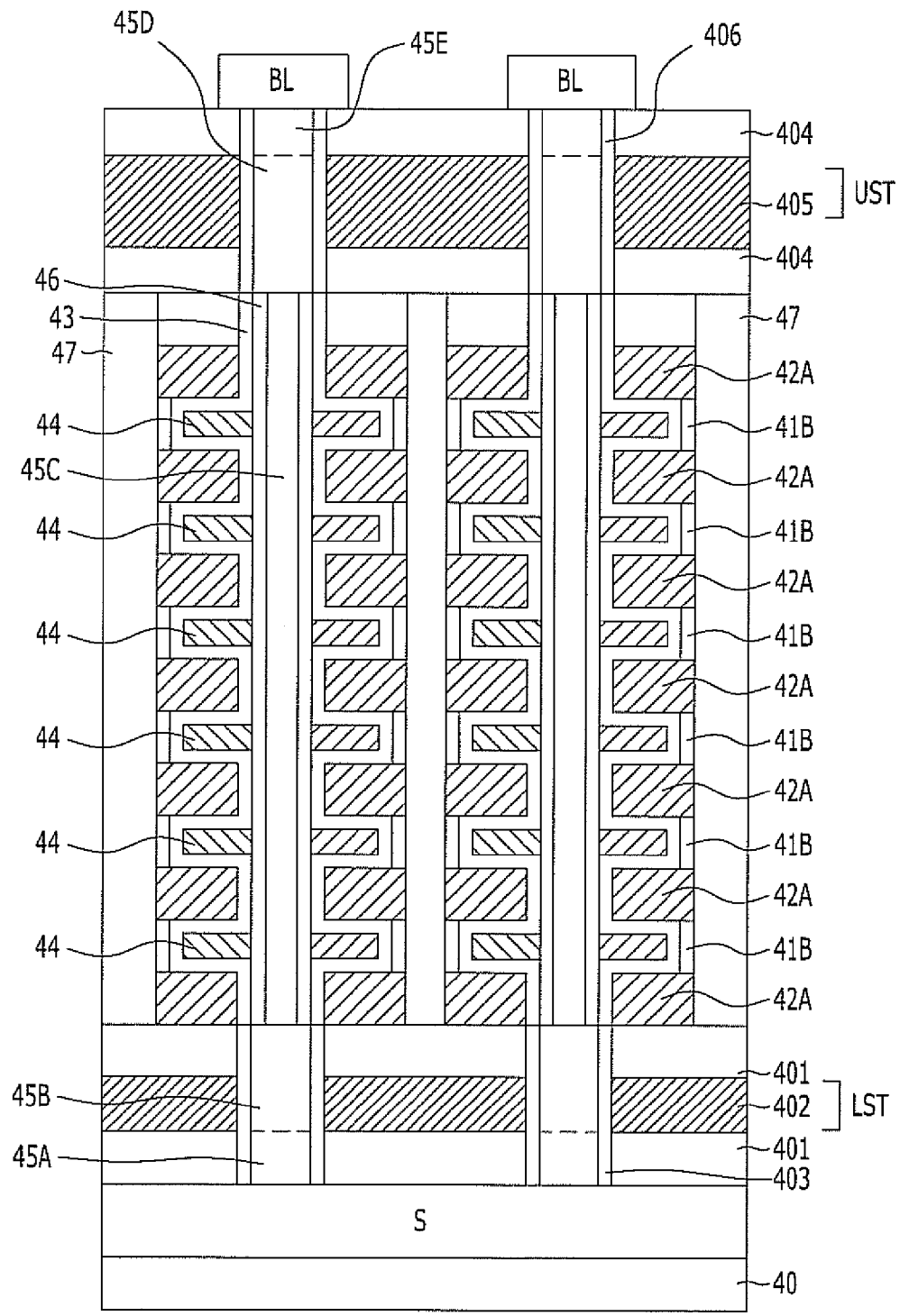

Referring to FIG. 4D, by selectively etching the plurality of second interlayer dielectric layers 41A and the plurality of second conductive layers 42 between the channels 45C, trenches are defined to separate memory cells of the respective channels 45C, and subsequently, a dielectric layer 47 is filled in the trenches. In this process, the second interlayer dielectric layers 41A and the second conductive layers 42, which have been patterned, are designated by the reference numerals 41B and 42A, respectively. The patterned second conductive layers 42A constitute control gate electrodes.

Subsequently, a third interlayer dielectric layer 404, a third conductive layer 405, and another third interlayer dielectric layer 404 are sequentially formed on the resultant structure including the floating gate electrodes 44 and the channels 45C, and subsequently, holes for channels of the upper selection transistors UST are formed to expose the channels 45C of the memory cells. After forming a gate dielectric layer 406 on the sidewalls of the holes for channels, channels 45D and 45E for the upper selection transistors UST are formed by filling a layer for channels. For illustration purposes, the channels 45D and 45E of the upper selection transistor UST are illustrated by being divided into a region 45E placed between a bit line BL and the third conductive layer 405 and a remaining region 45D. The layer for channels may be formed as an undoped semiconductor layer or a semiconductor layer doped with P-type impurities, for example, a polysilicon layer.

The region 45E may be doped with high density N-type impurities. Additionally, the region 45D of the upper selection transistors UST may be an undoped semiconductor layer or a semiconductor layer doped with P-type impurities, and the region 45E may be a semiconductor layer doped with N-type impurities. However, this process may be omitted, and if omitted, all the channels 45D and 45E of the upper selection transistors UST are an undoped semiconductor layer or a semiconductor layer doped with P-type impurities.

Subsequently, bit lines BL are formed through deposition and patterning of a conductive layer as described above.

Figure 5:
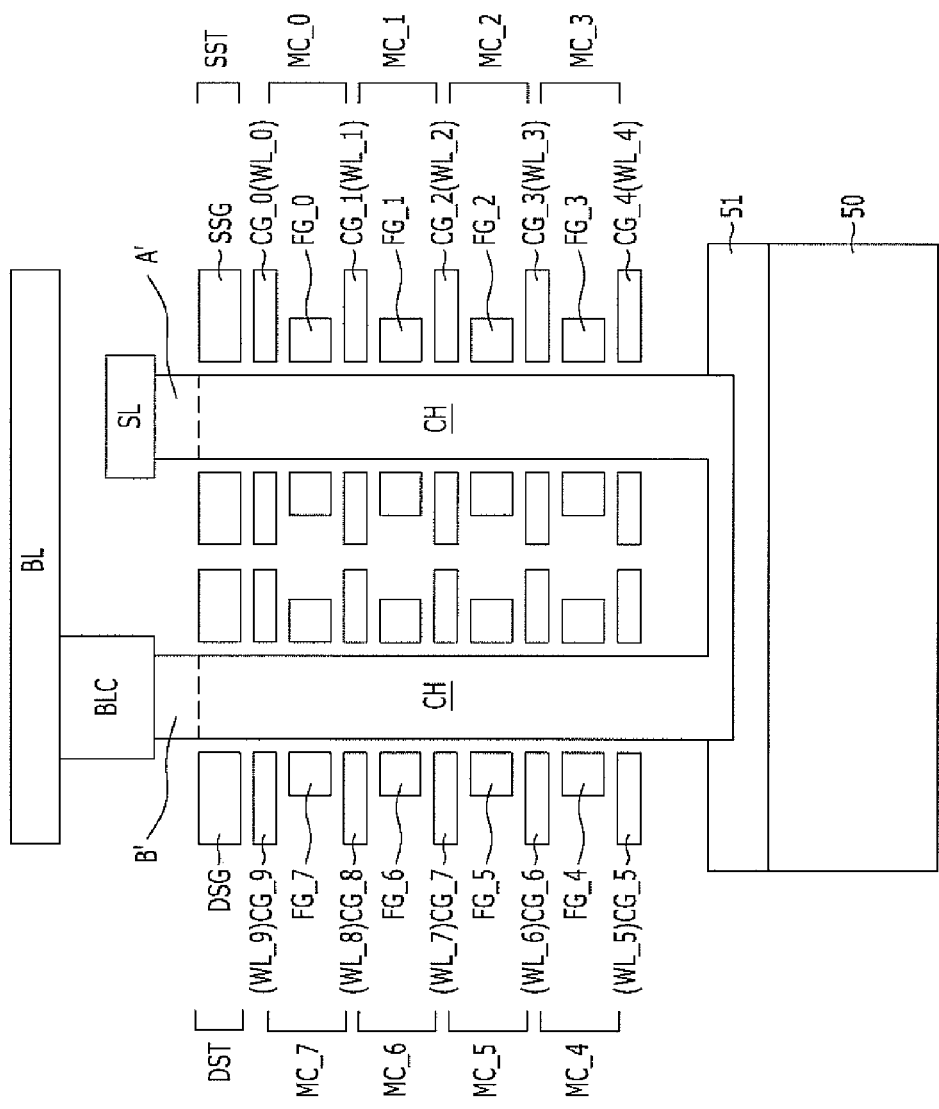
FIG. 5 is a view illustrating the configuration of a nonvolatile memory device with a three-dimensional structure in accordance with a second embodiment of the present invention.

FIG. 5 is a view illustrating the configuration of a nonvolatile memory device with a three-dimensional structure in accordance with a second embodiment of the present invention. For illustration purposes, channels, floating gate electrodes, and control gate electrodes are mainly illustrated, and dielectric layers interposed there between are omitted.

Referring to FIG. 5, the nonvolatile memory device with a three-dimensional structure in accordance with the second embodiment of the present invention includes a plurality of memory cells MC_0 to MC_7, which are stacked along a U-shaped channel CH formed over a substrate 50. In detail, the U-shaped channel CH includes a pair of pillar portions, which extend vertically from the substrate 50 and a connection portion, which connects the lower ends of the pair of pillar portions with each other. The connection portion is disposed on the substrate 50 and is controlled by a gate electrode 51, which covers the side and lower surfaces of the connection portion. The upper ends of the pair of pillar portions are respective connected with a bit line BL and a source line SL. Since the extending directions of the bit line BL and the source line SL may be different from each other, the bit line BL may be disposed on a layer different from the source line SL, for example, a layer higher than the source line SL. Accordingly, the bit line BL is connected with the upper end of one pillar portion by connecting to a bit line contact BLC.

The plurality of memory cells MC_0 to MC_7 are connected in series between a bit line-side selection transistor, more specifically, a drain selection transistor DST, and a source line-side selection transistor, more specifically, a source selection transistor SST, and constitute a U-shaped string. While the present embodiment illustrates that one string includes eight memory cells MC_0 to MC_7, the present invention is not limited to such, and the number of memory cells may increase or decrease. Therefore, when compared to the first embodiment, the degree of integration may be doubled.

The drain selection transistor DST is disposed over memory cell MC_7 and controls the electrical connection of the bit line BL and the string according to the voltage applied to a drain selection gate DSG. The source selection transistor SST is disposed over memory cell MC_0 and controls the electrical connection of the source line SL and the string according to the voltage applied to a source selection gate SSG.

As shown in FIG. 5, the channel CH is used as the channel of the drain selection transistor DST, the plurality of memory cells MC_0 to MC_7, and the source selection transistor SST. One upper end of the channel CH is connected to the bit line BL and the other upper end of the channel CH is connected to the source line SL. Here, portions of the pillar portions of the channel CH that correspond to the drain selection gate DSG, the plurality of memory cells MC_0 to MC_7, and the source selection gate SSG and the connection portion of the channel CH will be referred to as an intermediate portion of the channel CH, and the remaining portions of the channel CH, that are respectively adjacent to the source line S and the bit line BL, will be referred to as a first end A' and a second end B', respectively.

The intermediate portion of the channel CH may be an undoped semiconductor layer or a semiconductor layer doped with low density P-type impurities, for example, a polysilicon layer. The first end A' of the channel CH may have the same conductivity type as the intermediate portion of the channel CH, and accordingly, may be an undoped semiconductor layer or a semiconductor layer doped with low density P-type impurities, for example, a polysilicon layer. The second end B' of the channel CH may have the same conductivity type as the intermediate portion of the channel CH, or the second end B' of the channel CH may have a different conductivity type from the intermediate portion of the channel CH. In other words, the second end B' of the channel CH may be an undoped semiconductor layer or a semiconductor layer doped with low density P-type impurities, or a semiconductor layer doped with high density N-type impurities. Since the intermediate portion and the first end A' of the channel CH have the same conductivity type, the channel CH directly contacts the source line S. Where the second end B' of the channel CH has the same conductivity type as the intermediate portion of the channel CH, the channel CH also directly contacts the bit line BL.

Since the detailed configuration of the memory cells MC_0 to MC7 is substantially the same as the first embodiment except the number thereof, detailed descriptions thereof will be omitted.

According to the nonvolatile memory device in accordance with the second embodiment of the present invention, the same effects as in the first embodiment may be achieved. Further, the degree of integration of the nonvolatile memory device is increased.

FIGS. 6A to 6F are cross-sectional views illustrating the processes of a method for fabricating the nonvolatile memory device with a three-dimensional structure in accordance with the second embodiment of the present invention. For illustration purposes, descriptions with respect to those given above with reference to FIGS. 3A to 3G may be omitted.

Figure 6A:
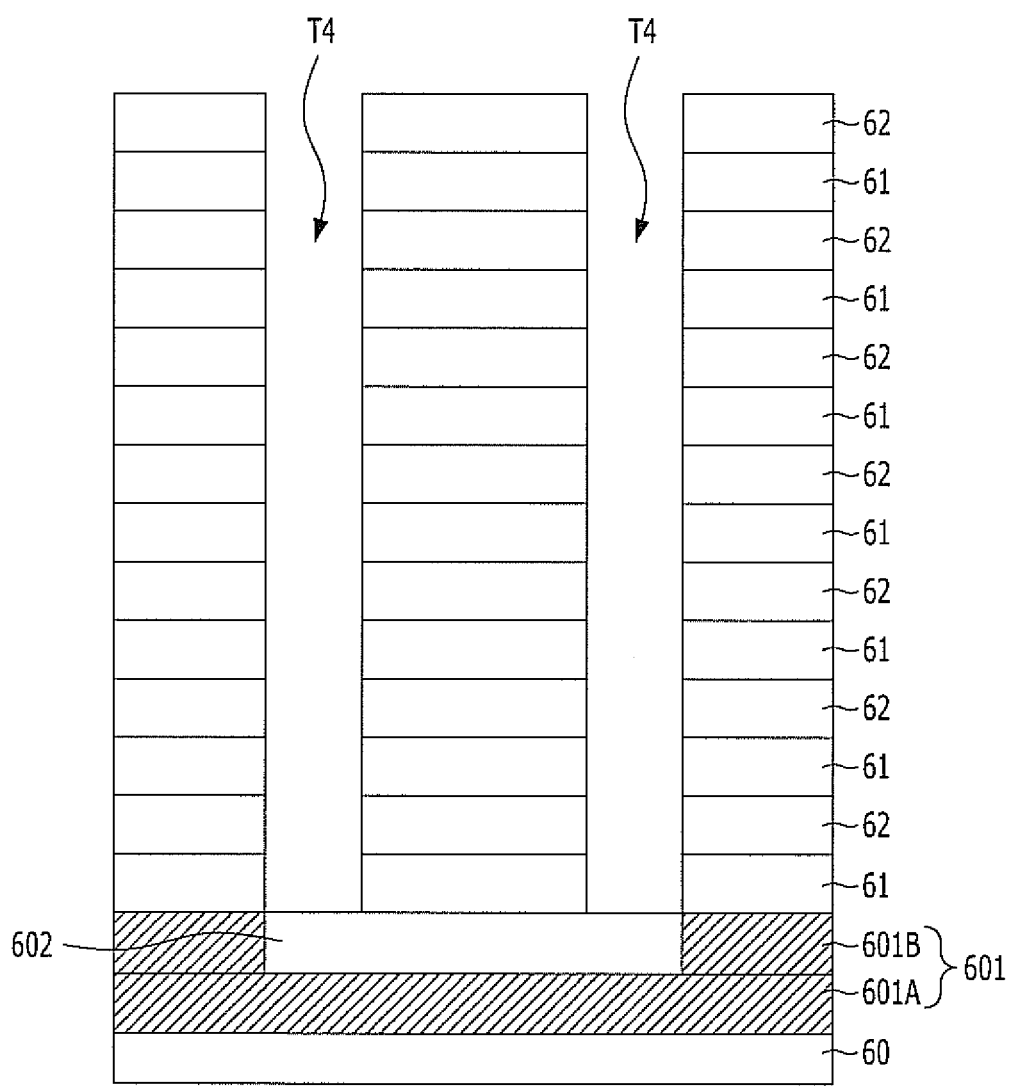
FIGS. 6A to 6F are cross-sectional views illustrating the processes of a method for fabricating the nonvolatile memory device with a three-dimensional structure in accordance with the second embodiment of the present invention.

Referring to FIG. 6A, a gate electrode 601 including a first sacrificial layer 602 embedded within the gate electrode 601 is formed on a substrate 60. The first sacrificial layer 602 defines a space for the connection part of a channel, and the gate electrode 601 controls the connection part.

In detail, a first conductive layer 601A is formed on the substrate 60. Next, the first sacrificial layer 602 is formed by depositing and patterning a substance for formation of the first sacrificial layer 602 on the first conductive layer 601A. After forming the first sacrificial layer 602, a second conductive layer 601B is formed on portions of the first conductive layer 601A that are exposed on both sides of the first sacrificial layer 602. The first and second conductive layers 601A and 601B constitute the gate electrode 601. The gate electrode 601 may include, for example, polysilicon doped with impurities, and the first sacrificial layer 602 may include, for example, a nitride layer.

Subsequently, a plurality of first interlayer dielectric layers 61 and a plurality of second sacrificial layers 62 are alternately formed on the gate electrode 601 and the first sacrificial layer 602.

Each first interlayer dielectric layer 61 may be formed as an oxide layer, for example, an SiO2 layer, and each second sacrificial layer 602 may be formed as a carbon layer, a nitride layer, or a substance layer with a higher etching selectivity than the interlayer dielectric layer 61, for example, an SiN layer.

Next, a pair of channel holes T4 is formed by etching the plurality of first interlayer dielectric layers 61 and the plurality of second sacrificial layers 62 to expose the first sacrificial layer 602.

Figure 6B:
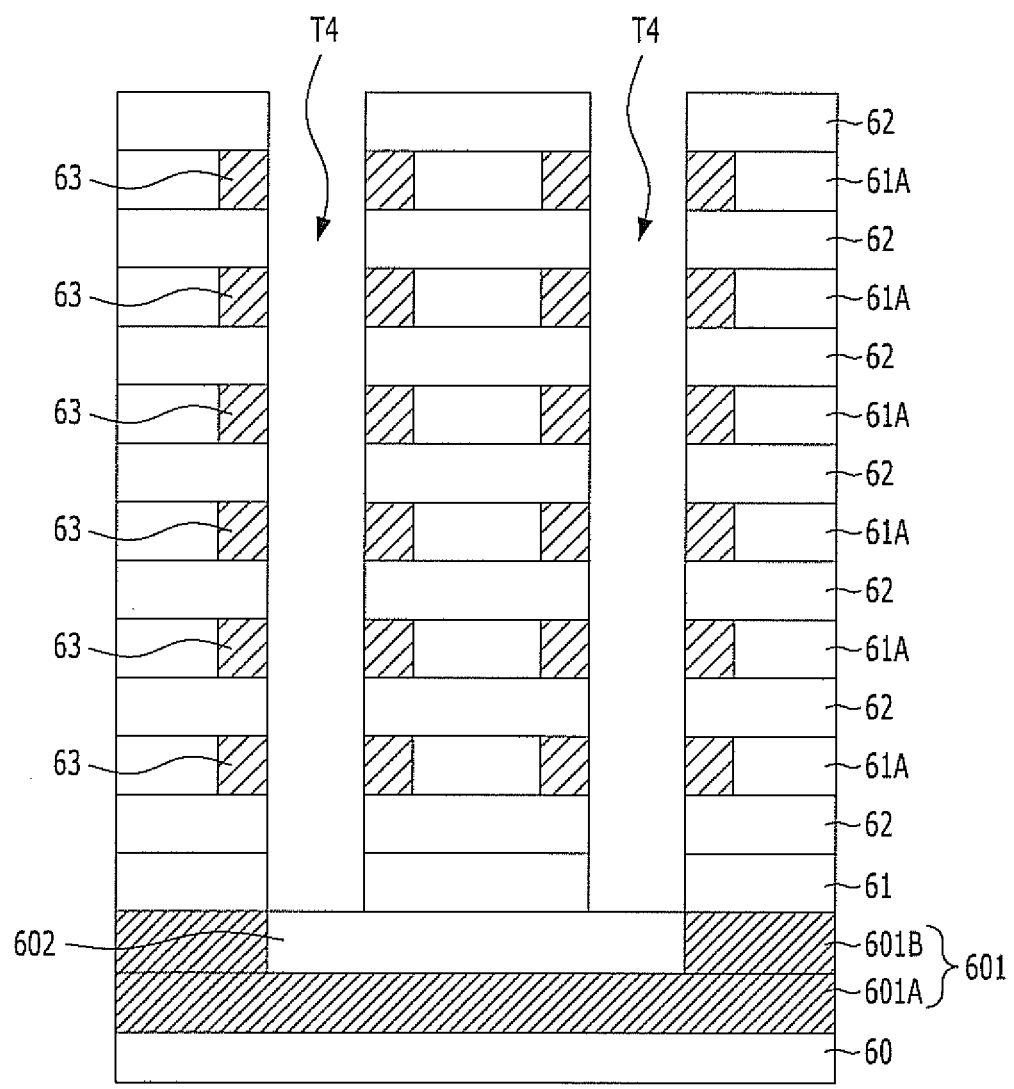

Referring to FIG. 6B, the first interlayer dielectric layers 61, which are exposed by the sidewalls of the cell channel holes T4, are recessed by a designated thickness. The recessing thickness may depend on the thickness of floating gate electrodes to be formed through a subsequent process. In FIG. 6B, the first interlayer dielectric layers 61, which are recessed by the designated thickness, are designated by the reference number 61A.

The first interlayer dielectric layers 61 may be recessed through a wet etching process or an isotropic etching process.

Subsequently, floating gate electrodes 63 are formed by filling a conductive layer in the recessed regions of the first interlayer dielectric layers 61A. The floating gate electrodes 63 may be formed by filling the conductive layer in the cell channel holes T4 including the recessed regions and performing an etch-back process for the conductive layer.

Figure 6C:
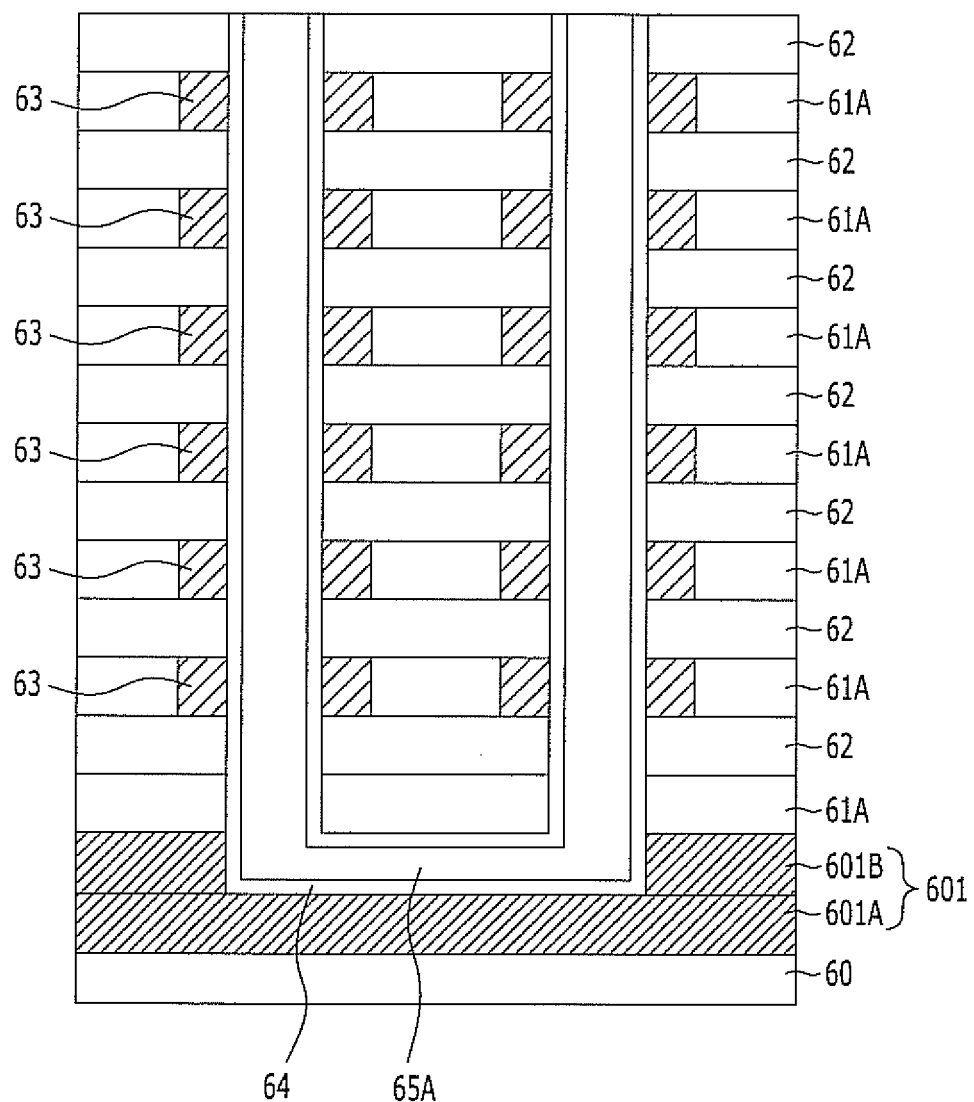

Referring to FIG. 6C, after removing the first sacrificial layer 602, a tunnel dielectric layer 64 is formed in the cell channel holes T4 and in a space created by removing the first sacrificial layer 602, and a U-shaped channel 65A is formed by filling a layer for a channel. The channel 65A is constituted by a Pair of pillar portions and a connection portion, which connects the lower ends of the pair of pillar portions. The layer for a channel may be formed as an undoped semiconductor layer or a semiconductor layer doped with P-type impurities. The semiconductor layer may be formed as a polysilicon layer.

Figure 6D:
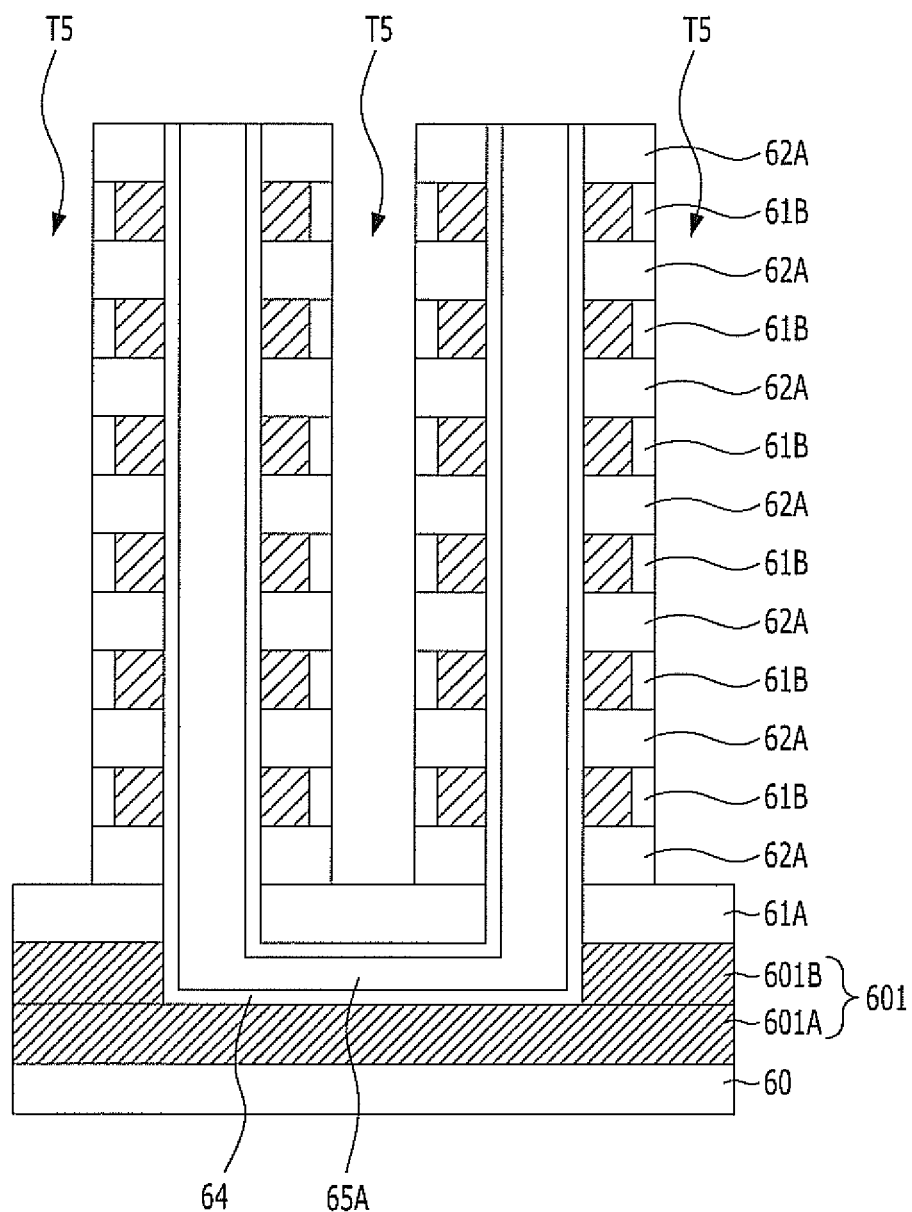

Referring to FIG. 6D, by selectively etching the plurality of first interlayer dielectric layers 61A and the plurality of second sacrificial layers 62 between channels 65A and between the pillar parts of each channel 65A, trenches T5 are formed. In FIG. 6D, the first interlayer dielectric layers 61A and the second sacrificial layers 62, which are patterned to form the trenches T5, are designated by the reference numerals 61B and 62A, respectively.

Through the process for forming the trenches T5, control gate electrodes, more specifically, word lines, may be formed in a subsequent process. The trenches T5 may be defined to a depth capable of exposing all of the plurality of second sacrificial layers 62A on the sidewalls of the trenches T5.

Figure 6E:
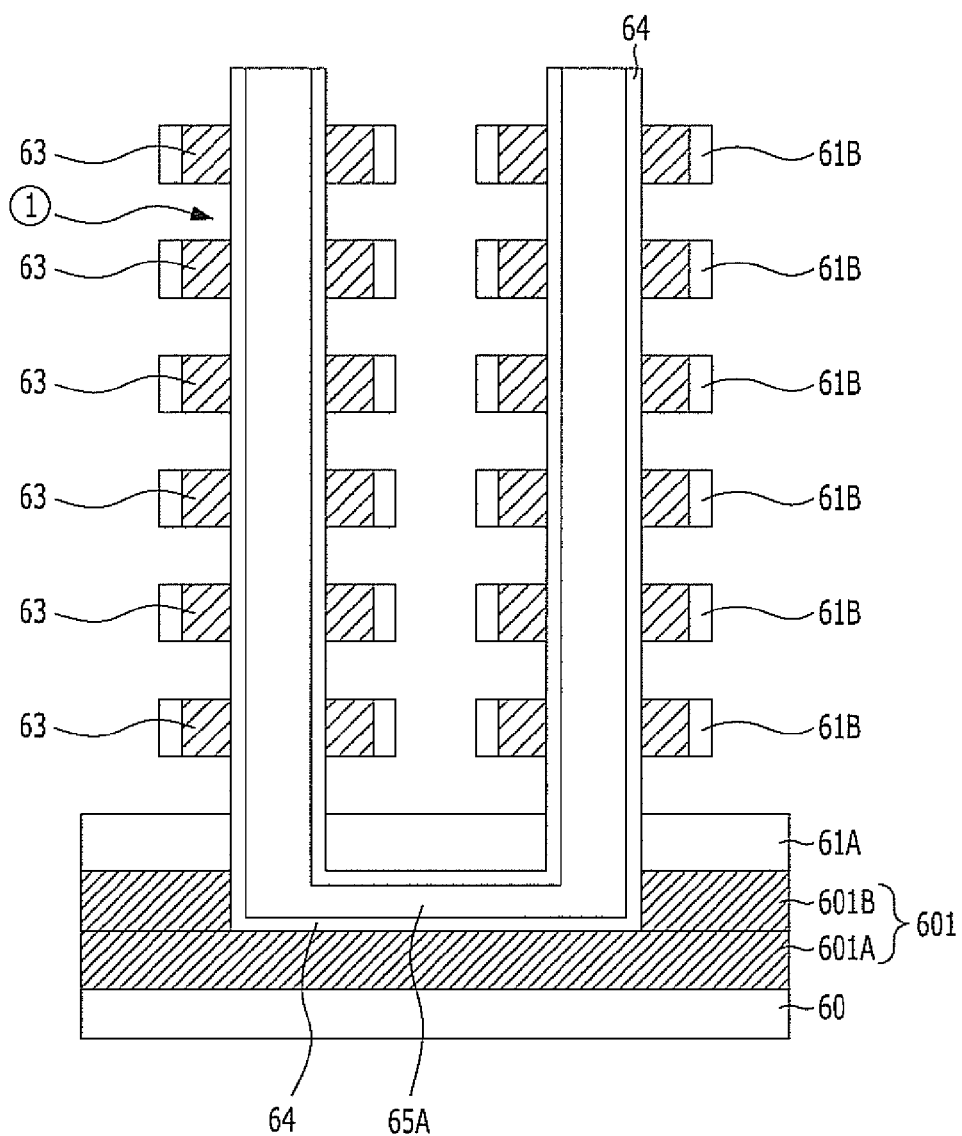

Referring to FIG. 6E, the second sacrificial layers 62A exposed on the walls of the trenches T5 are removed, and regions for forming a charge blocking layer and the control gate electrodes are formed between the plurality of floating gate electrodes 63 (see the reference symbol ①).

Figure 6F:
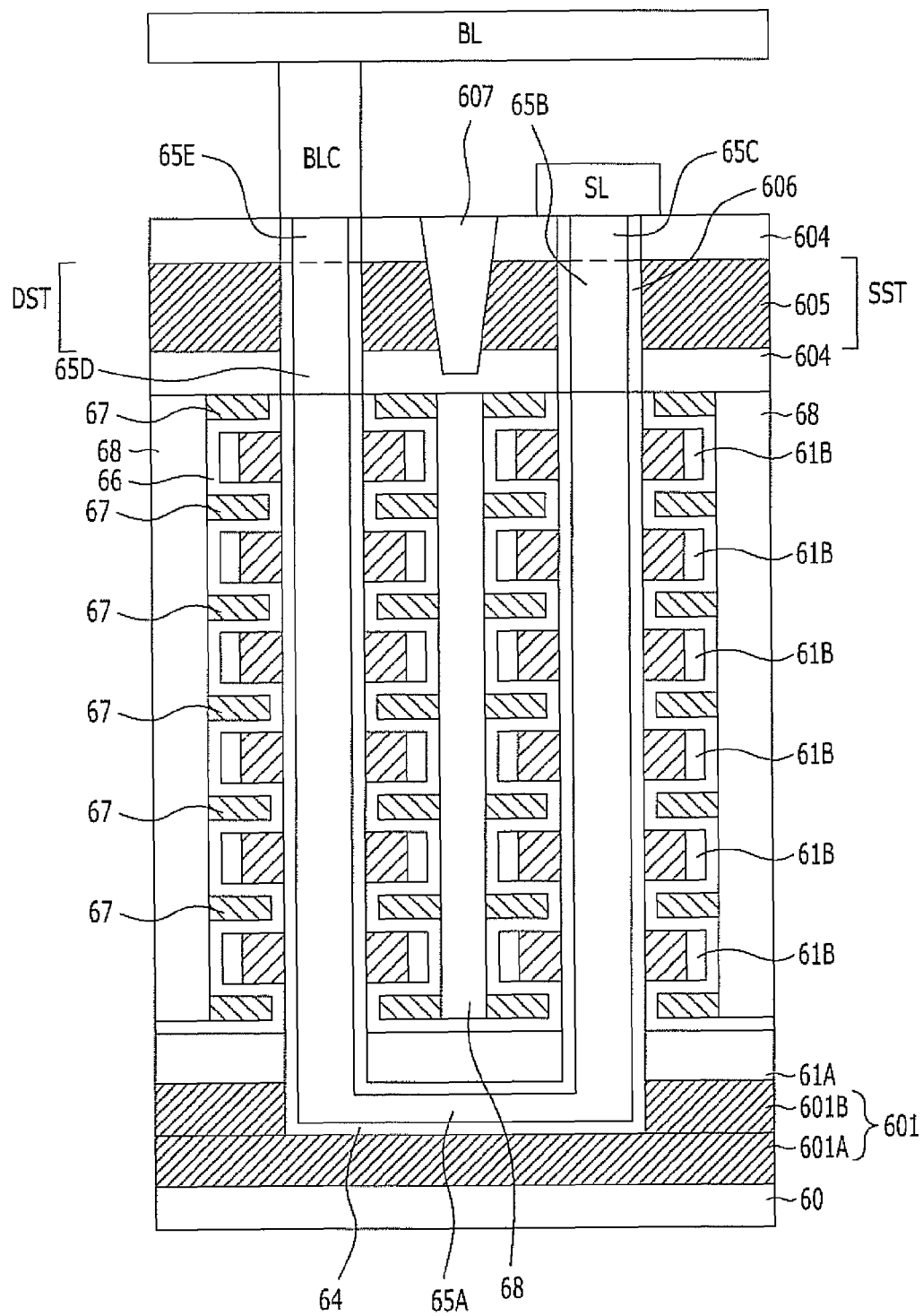

Referring to FIG. 6F, a charge blocking layer 66 is formed on the entire surface of the resultant structure after removing the second sacrificial layers 62A. The charge blocking layer 66 covers the entire surfaces of the floating gate electrodes 63 excluding the surfaces facing the channel 65A, and by forming the charge blocking layer 66 in this form, interference between adjoining memory cells may be reduced.

In this way, the charge blocking layer 66 is formed in portions of the regions ① (see FIG. 6E).

Next, by filling a conductive layer in the open regions ① between portions of the charge blocking layer 66, control gate electrodes 67 are formed.

The control gate electrodes 67 may be formed by filling the conductive layer in the trenches T5 including the open regions ① and performing an etch-back process for the conductive layer.

After the control gate electrodes 67 are formed, a dielectric layer 68 is filled in the remaining spaces between the control gate electrodes 67 and between portions of the charge blocking layer 66.

Subsequently, a structure including a drain selection transistor DST and a source selection transistor SST is formed.

In detail, a third interlayer dielectric layer 604, a conductive layer 605, and another third interlayer dielectric layer 604 are sequentially formed on the resultant structure including the charge blocking layer 66 and the dielectric layer 68. Subsequently, holes for channels are defined to expose the upper ends of the pair of pillar portions of the channel 65A. Subsequently, a gate dielectric layer 606 is formed on the sidewalls of the holes for channels, and channels 65B and 65C of the source selection transistor SST and channels 65D and 65E of the drain selection transistor DST are formed by filling a layer for channels. For illustration purposes, the channels 65B and 65C of the source selection transistor SST are illustrated as being divided into a region 65C placed between a source line SL and the conductive layer 605 and a remaining region 65B. The region 65C substantially corresponds to the first end A' of FIG. 5. Also, the channels 65D and 65E of the drain selection transistor DST are illustrated as being divided into a region 65E placed between a bit line BL and the conductive layer 605 and a remaining region 65D. The region 65E substantially corresponds to the second end B' of FIG. 5. The layer for channels may be formed as an undoped semiconductor layer or a semiconductor layer doped with P-type impurities, for example, a polysilicon layer.

The region 65E may be doped with high density N-type impurities. Additionally, the region 65D of the drain selection transistor DST may be an undoped semiconductor layer or a semiconductor layer doped with P-type impurities, and the region 65E may be a semiconductor layer doped with N-type impurities. However, this process may be omitted, and if omitted, the channels 65D and 65E of the drain selection transistors DST are an undoped semiconductor layer or a semiconductor layer doped with P-type impurities.

To isolate the drain selection transistor DST and the source selection transistor SST from each other, a slit, which cuts off the conductive layer 605 and extends in a direction crossing the conductive layer 605, is formed, and a dielectric layer 607 is formed to fill the slit.

By depositing and patterning a conductive substance on the resultant structure including the drain selection transistor DST and the source selection transistor SST, the source line SL is formed to be connected with the channels 65B and 65C of the source selection transistors SST and extend in a first direction.

Subsequently, a dielectric layer (not shown) is formed to cover the source line SL, and a bit line contact BLC is formed to be connected with the channels 65D and 65E of the drain selection transistor DST through the dielectric layer. Thereafter, the bit line BL is formed on the dielectric layer to be connected with the bit line contact BLC and extend in a direction crossing the source line SL.

While it was described that the nonvolatile memory device described above is structured to include memory cells that are stacked along a vertical channel and a unit memory cell includes one floating gate electrode and two control gate electrodes that are respectively disposed over and under the floating gate electrode, the present invention is not limited to such. The present invention may be applied to all nonvolatile memory devices with a three-dimensional structure where a plurality of memory cells are stacked along a vertical channel, which will be exemplarily explained below with reference to FIGS. 7 and 8.

Figure 7:
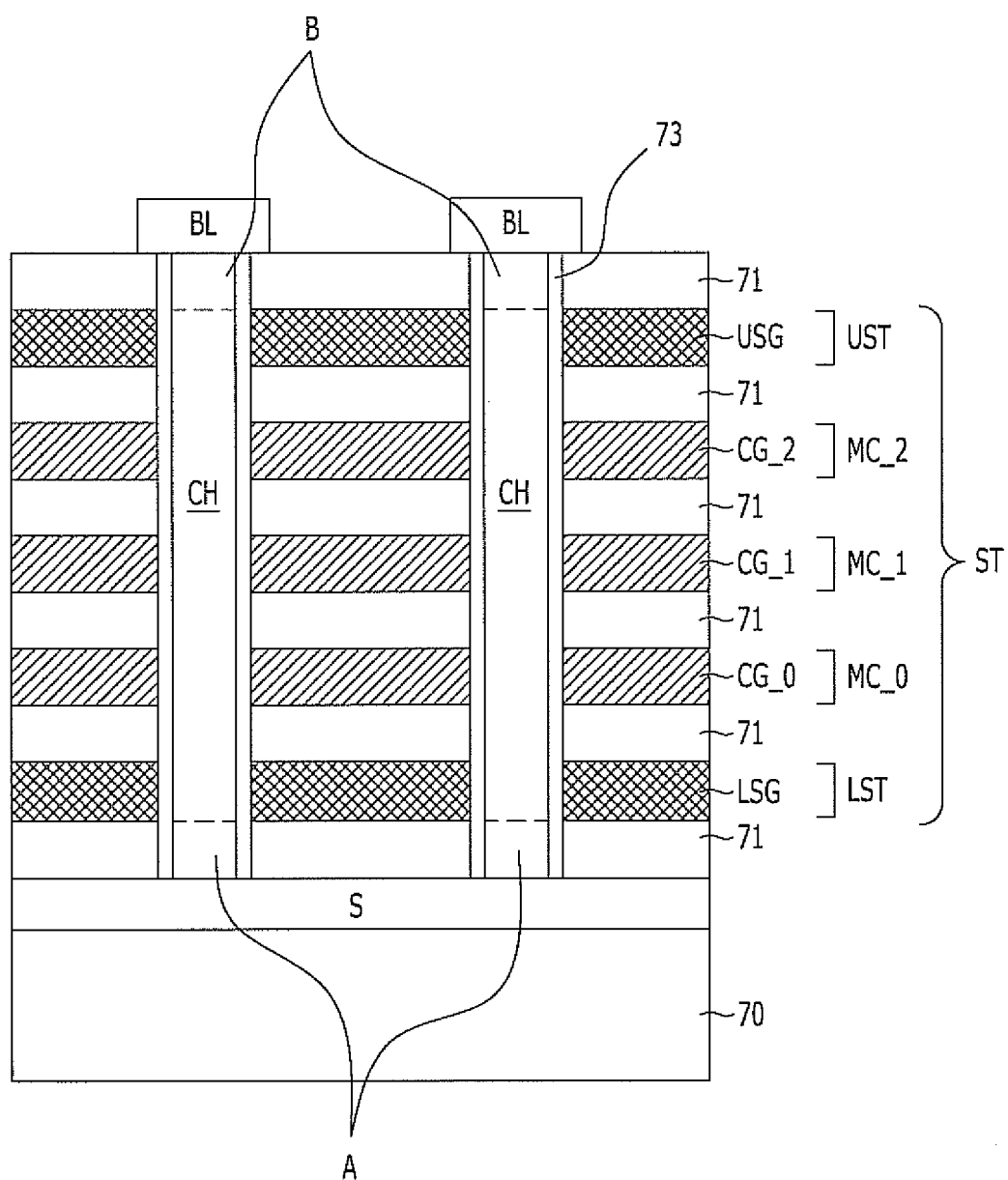
FIG. 7 is a cross-sectional view illustrating a nonvolatile memory device with a three-dimensional structure in accordance with a third embodiment of the present invention

FIG. 7 is a cross-sectional view illustrating a nonvolatile memory device with a three-dimensional structure in accordance with a third embodiment of the present invention and a method for fabricating the same.

Describing the device first, the nonvolatile memory device with a three-dimensional structure in accordance with the third embodiment of the present invention includes a plurality of memory cells MC_0 to MC_2, which are stacked along a channel CH vertically extending from a substrate 70 formed with a source region S. The plurality of memory cells MC_0 to MC_2 are connected in series between a lower selection transistor LST and an upper selection transistor UST and constitute one string ST. The upper selection transistor UST is disposed over the plurality of memory cells MC_0 to MC_2 and controls the electrical connection of a bit line BL and the string ST according to a voltage applied to an upper selection gate USG. The lower selection transistor LST is disposed under the plurality of memory cells MC_0 to MC_2 and controls the electrical connection of the source region S and the string ST according to a voltage applied to a lower selection gate LSG.

The lower end of the channel CH is connected to the source region S, and the upper end of the channel CH is connected to the bit line BL. Here, a portion of the channel CH that corresponds to a region where the lower selection gate LSG, the plurality of memory cells MC_0 to MC_2 and the upper selection gate USG are formed will be referred to as an intermediate portion of the channel CH, and the remaining portions of the channel CH that are respectively adjacent to the source region S and the bit line BL will be referred to as a first end A and a second end B, respectively.

The intermediate portion of the channel CH may be an undoped semiconductor layer or a semiconductor layer doped with low density P-type impurities, for example, a polysilicon layer. The first end A of the channel CH may have the same conductivity type as the intermediate portion of the channel CH, and accordingly, may be an undoped semiconductor layer or a semiconductor layer doped with low density P-type impurities, for example, a polysilicon layer. The second end B of the channel CH may have the same conductivity type as the intermediate portion of the channel CH or a different conductivity type from the intermediate portion of the channel CH. In other words, the second end B of the channel CH may be an undoped semiconductor layer, or the second end B of the channel CH may be a semiconductor layer doped with low density P-type impurities, or a semiconductor layer doped with high density N-type impurities.

Since the intermediate portion and the first end A of the channel CH have the same conductivity type, the channel CH directly contacts the source region S. In the embodiment where the second end B of the channel CH has the same conductivity type as the intermediate portion of the channel CH, the channel CH also directly contacts the bit line BL.

The memory cells MC_0 to MC_2 include a plurality of control gate electrodes CG, which are stacked along the channel CH, and a memory layer 73, which is interposed between the channel CH and the control gate electrodes CG. The plurality of control gate electrodes CG are isolated from one another by interlayer dielectric layers 71. The memory layer 73 may have a triple-layered structure including a tunnel dielectric layer, a charge storage layer, and a charge blocking layer that are sequentially formed in the channel CH. In detail, the tunnel dielectric layer for charge tunneling between the channel CH and the charge storage layer may include an oxide layer. The charge storage layer stores charges and may include a nitride layer. And, the charge blocking layer prevents movement of the charges stored in the charge storage layer to the control gate electrodes CG and may include an oxide layer.

The nonvolatile memory device in accordance with the third embodiment of the present invention has a similar structure to the first embodiment except the configuration of the memory cells, and accordingly, since the potential of the channel is controlled by the voltage applied to the source region and/or the bit line, an F-N tunneling erase may be performed.

Next, a fabrication method will be briefly described below.

First, a plurality of interlayer dielectric layers 71 and a plurality of conductive layers for gate electrodes are alternately formed on a substrate 70 formed with a source region S through doping of impurities, etc. A conductive layer for a gate electrode, which is placed lowermost, forms a gate electrode LSG of a lower selection transistor LST, a conductive layer for a gate electrode, which is placed uppermost, forms a gate electrode USG of an upper selection transistor UST, and the remaining conductive layers for gate electrodes form control gate electrodes CG constituting memory cells MC.

Next, after forming a channel hole by selectively etching the plurality of interlayer dielectric layers 71 and the plurality of conductive layers for gate electrodes to expose the source region S, a memory layer 73 is formed on the wall of the channel hole. The memory layer 73 may be formed by sequentially depositing a tunnel dielectric layer, a charge storage layer, and a charge blocking layer, for example, into an ONO (oxide-nitride-oxide) structure.

Subsequently, a channel CH is formed by filling a layer for a channel in the channel hole. The layer for a channel may be formed as an undoped semiconductor layer or a semiconductor layer doped with P-type impurities, for example, a polysilicon layer.

Thereafter, high density N-type impurities may be doped into a second end B of the channel CH. Additionally, a first end A and an intermediate portion of the channel CH may be an undoped semiconductor layer or a semiconductor layer doped with P-type impurities, and the second end B of the channel CH may be a semiconductor layer doped with N-type impurities. However, this process may be omitted, and if omitted, the entire channel CH is an undoped semiconductor layer or a semiconductor layer doped with P-type impurities.

Thereafter, by depositing and patterning a conductive layer on the resultant structure including the gate electrodes 71 and the channel CH, a bit line BL is formed to be connected with the channel CH and extend in a first direction.

Figure 8:
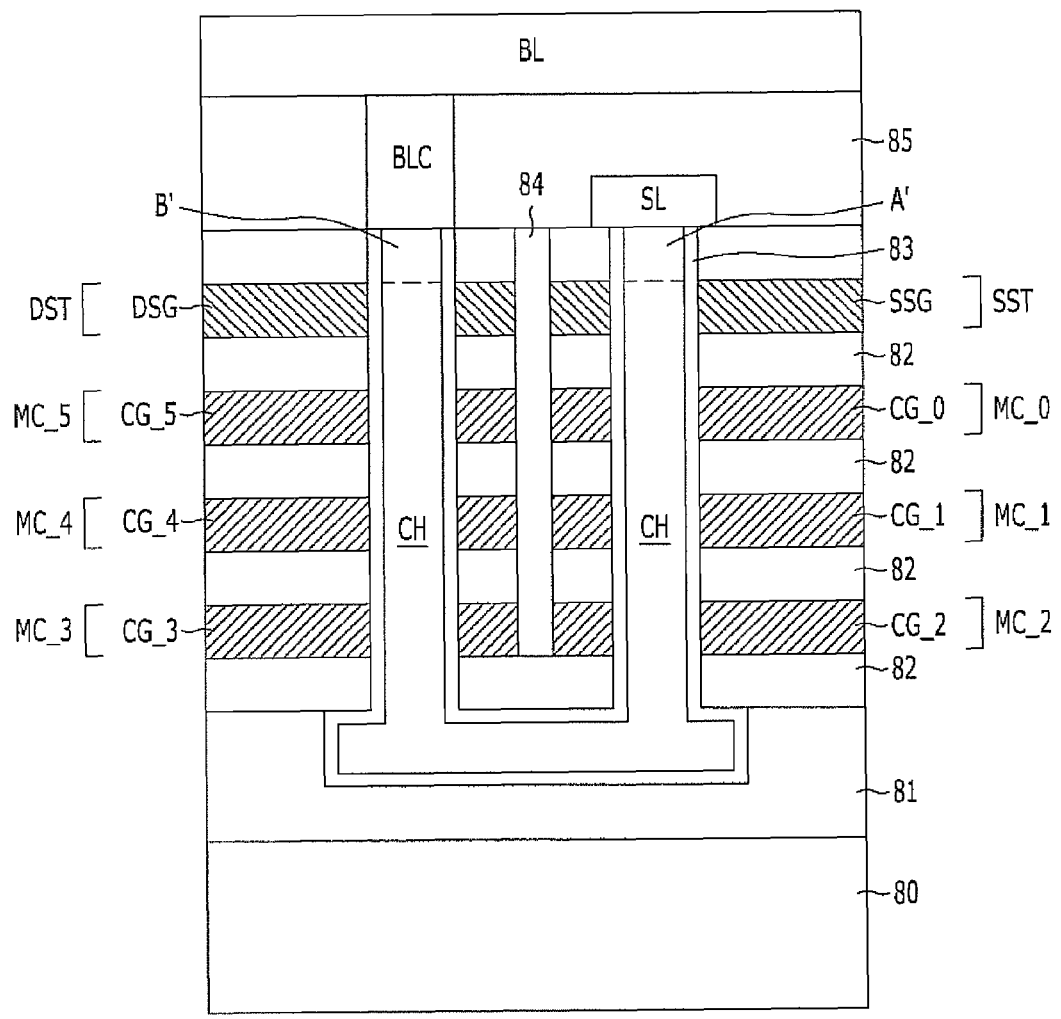
FIG. 8 is a cross-sectional view explaining a nonvolatile memory device with a three-dimensional structure in accordance with a fourth embodiment of the present invention.

FIG. 8 is a cross-sectional view illustrating a nonvolatile memory device with a three-dimensional structure in accordance with a fourth embodiment of the present invention and a method for fabricating the same.

Describing the device first, the nonvolatile memory device with a three-dimensional structure in accordance with the fourth embodiment of the present invention includes a plurality of memory cells MC_0 to MC_5, which are formed along a U-shaped channel CH formed on a substrate 80. In detail, the U-shaped channel CH includes a pair of pillar portions, which extend vertically from the substrate 80, and a connection portion, which connects the lower ends of the pair of pillar portions with each other. The connection portion is disposed on the substrate 80 and is controlled by a gate electrode 81, which covers the side and lower surfaces of the connection portion. The upper ends of the pair of pillar portions are respective connected with a bit line BL and a source line SL. Since the extending directions of the bit line BL and the source line SL may be different from each other, the bit line BL may be disposed on a layer different from the source line SL, for example, a layer higher than the source line SL. Accordingly, the bit line BL is connected with the upper end of one pillar portion by connecting to a bit line contact BLC.

The plurality of memory cells MC_0 to MC_5 are connected in series between a bit line-side selection transistor, more specifically, a drain selection transistor DST and a source line-side selection transistor, more specifically, a source selection transistor SST, and constitute a U-shaped string. While the present embodiment illustrates that one string includes six memory cells MC_0 to MC_5, the present invention is not limited to such, and the number of memory cells may increase or decrease. Therefore, when compared to the third embodiment, the degree of integration may be doubled.

The drain selection transistor DST is disposed over memory cell MC_5 and controls the electrical connection of the bit line BL and the string according to the voltage applied to a drain selection gate DSG. The source selection transistor SST is disposed over memory cell MC_0 and controls the electrical connection of the source line SL and the string according to the voltage applied to a source selection gate SSG.

As shown in FIG. 8, the channel CH is used as the channel of the drain selection transistor DST, the plurality of memory cells MC_0 to MC_5, and the source selection transistor SST. One upper end of the channel CH is connected to the bit line BL and the other upper end of the channel CH is connected to the source line SL. Here, portions of the channel CH that are formed with the drain selection gate DSG, the plurality of memory cells MC_0 to MC_5, and the source selection gate SSG will be referred to as an intermediate portion of the channel CH, and the remaining portions of the channel CH that are respectively adjacent to the source line S and the bit line BL will be referred to as a first end A' and a second end B', respectively.

The intermediate portion of the channel CH may be an undoped semiconductor layer or a semiconductor layer doped with low density P-type impurities, for example, a polysilicon layer. The first end A' of the channel CH may have the same conductivity type as the intermediate portion of the channel CH, and accordingly, may be an undoped semiconductor layer or a semiconductor layer doped with low density P-type impurities, for example, a polysilicon layer. The second end B' of the channel CH may have the same conductivity type as the intermediate portion of the channel CH, or the second end B' of the channel CH may have a different conductivity type from the intermediate portion of the channel CH. In other words, the second end B' of the channel CH may be an undoped semiconductor layer or a semiconductor layer doped with low density P-type impurities, or a semiconductor layer doped with high density N-type impurities.

Since the intermediate portion and the first end A' of the channel CH have the same conductivity type, the channel CH directly contacts the source line SL. Where the second end B' of the channel CH has the same conductivity type as the intermediate portion of the channel CH, the channel CH also directly contacts the bit line BL.

Since the detailed configuration of the memory cells MC_0 to MC5 is substantially the same as the third embodiment except the number thereof, detailed descriptions thereof will be omitted herein.

A slit is formed, and a dielectric layer 84 is filled in the slit between the pair of pillar parts of the channel CH to isolate all layers of gate electrodes DSG, SSG, and CG and extend in a first direction. As a result of forming the slit and the dielectric layer 84, the memory cells MC, the drain selection transistor DST, and the source selection transistor SST are isolated from one another.

According to the nonvolatile memory device in accordance with the fourth embodiment of the present invention, the same effects as in the third embodiment may be achieved. Further, the degree of integration of the nonvolatile memory device is increased.

Next, a fabrication method will be briefly described below.

First, a gate electrode 81 with a sacrificial layer (not shown) is formed on a substrate 80. The gate electrode 81 covers and controls the connection part of a channel CH.

Subsequently, a plurality of interlayer dielectric layers 82 and a plurality of conductive layers for gate electrodes are alternately formed on the gate electrode 81. A conductive layer for a gate electrode, which is placed uppermost, forms a gate electrode DSG of a drain selection transistor DST and a gate electrode SSG of a source selection transistor SST, and the remaining conductive layers for gate electrodes form control gate electrodes CG constituting memory cells MC.

Thereafter, by selectively etching the plurality of interlayer dielectric layers 82 and the plurality of conductive layers for gate electrodes, a pair of channel holes is formed to expose the sacrificial layer (not illustrated). After removing the sacrificial layer, a memory layer 83 is formed on the sidewalls of the pair of channel holes and on the walls of a space created by removing the sacrificial layer. The memory layer 83 may be formed by sequentially depositing a tunnel dielectric layer, a charge storage layer, and a charge blocking layer, for example, into an ONO (oxide-nitride-oxide) structure.

Subsequently, the channel CH is formed by filling a layer for a channel in the channel holes. The layer for a channel may be formed as an undoped semiconductor layer or a semiconductor layer doped with P-type impurities, for example, a polysilicon layer.

A slit is defined by selectively etching the resultant structure including the channels CH and the memory layer 83 between a pair of pillar portions of the channel CH to a depth passing through the lowermost conductive layer for a gate electrode 82, and a dielectric layer 84 is filled in the slit.

In succession, high density N-type impurities may be doped into a second end B' of the channel CH. Additionally, a first end A' and an intermediate portion of the channel CH may be an undoped semiconductor layer or a semiconductor layer doped with P-type impurities, and the second end B' of the channel CH may be a semiconductor layer doped with N-type impurities. However, this process may be omitted, and if omitted, the entire channel CH is an undoped semiconductor layer or a semiconductor layer doped with P-type impurities.

Thereafter, by depositing and patterning a conductive layer on the resultant structure including the slit 84, a source line SL is formed to be connected with a first pillar portion of the channel CH and extend in a first direction.

Subsequently, a dielectric layer 85 is formed to cover the source line SL, and a bit line contact BLC is formed to be connected with a second pillar portion of the channel CH through the dielectric layer 85. Thereafter, a bit line BL is formed by depositing and patterning a conductive layer on the dielectric layer 85 to be connected with the bit line contact BLC, and the bit line BL extends in a direction crossing the source line SL.

Hereafter, an erase operation of the nonvolatile memory devices in accordance with the above-described embodiments will be described. The following erase operation may be applied to any of the first to fourth embodiments. Further, the following erase operation may be applied to all nonvolatile memory devices with a three-dimensional structure that includes a plurality of memory cells are stacked along a channel vertically extending from a substrate. For illustration purposes, a description of the erase operation will be given with reference to the memory device according to the first embodiment (see FIG. 2A).

In the nonvolatile memory device in accordance with the embodiments of the present invention, an F-N tunneling erase may be performed. More specifically, data is erased by discharging the charges that are stored in the conductive band of the floating gate electrode FG to the channel CH through F-N tunneling.

In order to induce an F-N tunneling phenomenon, a potential difference between the floating gate electrode FG and the channel CH should be great. There are two methods for achieving a great potential difference between the floating gate electrode FG and the channel CH. In a first method, a high negative voltage (a negative erase voltage) is applied to the control gate electrode CG, and a voltage higher than the high negative voltage is applied to the channel CH so that the charges stored in the floating gate electrode FG are discharged. The voltage applied to the channel CH is higher than the high negative voltage so that a substantial difference between the high negative voltage, for example, a ground voltage, and the voltage applied to the channel is achieved. In a second method, a high positive voltage (a positive erase voltage) is applied to the channel CH and a voltage lower than the high positive voltage is applied to the control gate electrode CG so that the charges stored in the floating gate electrode FG are erased. The voltage applied to the channel CH is lower than the high positive voltage so that a substantial difference between the high positive voltage and the voltage applied to the channel is achieved. The respective methods will be described below.

(First Method)

In the device shown in FIG. 2A, where the intermediate portion and the first end A of the channel CH are an undoped semiconductor layer or a semiconductor layer doped with low density P-type impurities, and the second end B of the channel CH is a semiconductor layer doped with high density N-type impurities, a voltage is applied as follows.

By applying a high negative voltage (a negative erase voltage) to the control gate electrode CG, a negative potential is transferred to the floating gate electrode FG. The negative erase voltage may be −10V to −20V.

A first voltage higher than the high negative voltage may be applied to the channel CH. Here, a substantial difference between the first voltage and the negative erase voltage is achieved, which means that a degree by which charge tunneling between the channel CH and the floating gate electrode FG may occur by a potential difference between the channel CH and the floating gate electrode FG. The first voltage may be 0V to 10V and may be controlled to maintain an appropriate difference with respect to the negative erase voltage depending upon the negative erase voltage. For example, when the negative erase voltage is −20V, the first voltage may be a ground voltage of 0V. Otherwise, when the negative erase voltage is −17V, the first voltage may be +3V. Further, when the negative erase voltage is −10V, the first voltage may be +10V.

While the channel CH is isolated from the bit line BL by the second end B, which is doped with the high density N-type impurities, the channel CH is directly connected with the source region S. Accordingly, by applying the first voltage to the source region S and applying a first pass voltage, which turns on the lower selection transistor LST, to the gate LSG of the lower selection transistor LST, the potential of the source region S is transferred to the channel CH. The first pass voltage may have a value of 1V to 11V and may be, for example, 4.5V.

The same voltage as that applied to the source region S, for example, the ground voltage, may be applied to the bit line BL, or the bit line BL may be in a floated state. The same voltage as that applied to the bit line BL, for example, the ground voltage, or a pass voltage (for example, 4.5V) may be applied to the gate USG of the upper selection transistor UST, or the gate USG of the upper selection transistor UST may be in a floated state. Because the above described voltages may be applied to the bit line BL because, in the present embodiment, even when the potential of the bit line BL is not transferred to the channel CH, no issues exist.

As a bias is applied in this way, since the high negative voltage is applied to the control gate electrode CG and the voltage with a great potential difference with respect to the control gate electrode CG is applied to the channel CH, an F-N tunneling erase may be performed. Also, by performing the F-N tunneling erase operation in this way, an erase operation speed may be increased. Also, because the channel CH is an undoped semiconductor layer or a semiconductor layer doped with P-type impurities, a source for supplying holes to the channel CH may be secured. Moreover, because the channel CH is directly connected with and is controlled by the source region S, the potential of the channel CH may be prevented from being boosted even though the high negative voltage is applied to the control gate electrode CG.

Additionally, in the device shown in FIG. 2A, where all the intermediate portion, the first end A, and the second end B of the channel CH are an undoped semiconductor layer or a semiconductor layer doped with low density P-type impurities, the voltages applied to the control gate electrode CG, the source region S, and the gate LSG of the lower selection transistor LST are the same as described above. However, a voltage the same as that applied to the source line SL is applied also to the bit line BL, and a voltage the same as that applied to the gate LSG of the lower selection transistor LST is applied to the gate USG of the upper selection transistor UST. As a result, the potentials of the source region S and the bit line BL are transferred to the channel CH.

(Second Method)

In the device shown in FIG. 2A, where the intermediate portion and the first end A of the channel CH are an undoped semiconductor layer or a semiconductor layer doped with low density P-type impurities, and the second end B of the channel CH is a semiconductor layer doped with high density N-type impurities, a voltage is applied as follows.

A high positive voltage (a positive erase voltage) may be applied to the channel CH, and a second voltage lower than the high positive voltage may be applied to the control gate electrode CG. Here, a substantial difference between the second voltage and the positive erase voltage is achieved, which means that a degree by which charge tunneling between the channel CH and the floating gate electrode FG may occur by a potential difference between the channel CH and the floating gate electrode FG. The positive erase voltage may be, for example, +20V, and the second voltage may be, for example, the ground voltage of 0V.

While the channel CH is isolated from the bit line BL by the second end B, which is doped with the high density NI-type impurities, the channel CH is directly connected with the source region S. Accordingly, by applying the positive erase voltage to the source region S and applying a pass voltage, which turns on the lower selection transistor LST and transfers the positive erase voltage to the channel CH, to the gate LSG of the lower selection transistor LST, the potential of the source region S is transferred to the channel CH. The pass voltage should have a value raised by a designated level (for example, 1V) when compared to the positive erase voltage, and may be, for example, +21V.

The bit line BL and the gate USG of the upper selection transistor UST may be in a floated state.

As a bias is applied in this way, since the high positive voltage is applied to the channel CH and the voltage with a great potential difference with respect to the channel CH is applied to the control gate electrode CG, and F-N tunneling erase may be performed. Also, by performing the F-N tunneling erase operation in this way, erase operation speed may be increased. Also, because the channel CH is an undoped semiconductor layer or a semiconductor layer doped with P-type impurities, a source for supplying holes to the channel CH may be secured. Moreover, because the channel CH is directly connected with and is controlled by the source region S, the potential of the channel CH may be prevented from being boosted.

Additionally, in the device shown in FIG. 2A, where all the intermediate portion, the first end A, and the second end B of the channel CH are an undoped semiconductor layer or a semiconductor layer doped with low density P-type impurities, the voltages applied to the control gate electrode CG, the source region S, and the gate LSG of the lower selection transistor LST are the same as described above. However, a voltage the same as that applied to the source line SL, more specifically, the high positive voltage, is applied also to the bit line BL, and a voltage the same as that applied to the gate LSG of the lower selection transistor LST, more specifically, a voltage raised by a designated level when compared to the high positive voltage, is applied to the gate USG of the upper selection transistor UST. As a result, the potentials of the source region S and the bit line BL are transferred to the channel CH.

While the method for operating a nonvolatile memory device was described with reference to the nonvolatile memory device according to the first embodiment shown in FIG. 2A, a person having ordinary skill in the art will readily appreciate that the operating method may be applied to the second to fourth embodiments. However, in the nonvolatile memory devices according to the second to fourth embodiments, it the same voltage is applied to the source line SL instead of the source region S.

According to the embodiments of the present invention, it is possible to provide a nonvolatile memory device with a three-dimensional structure having excellent erase operation characteristics and a method for operating the same.

While the present invention has been described with respect to the specific embodiments, it will be apparent to those skilled in the art that various changes and modifications may be made without departing from the spirit and scope of the invention as defined in the following claims.

What is claimed is:

1. A method for operating a nonvolatile memory device, comprising:
    applying a negative erase voltage to a control gate electrode of a memory cell; and
    applying a first voltage higher than the negative erase voltage to a channel through a source region to erase charges stored in the memory cell through F-N tunneling,
    wherein the nonvolatile memory device comprises:
        the channel vertically extending from a substrate;
        a plurality of memory cells stacked along the channel;
        the source region connected to a first end portion of the channel; and
        a bit line connected to a second end portion of the channel,
    wherein the first end portion of the channel is formed as an undoped semiconductor layer or a semiconductor layer doped with P-type impurities,
    wherein the second end portion of the channel is formed of a semiconductor material of which a conductivity type is different from that of the first end portion, and
    wherein an intermediate portion of the channel is provided between the first end portion and the second end portion and is formed of a semiconductor material of which a conductivity type is the same as that of the first end portion.

2. The method of claim 1, wherein the second end portion of the channel that adjoins the bit line is formed as a semiconductor layer doped with N-type impurities, and wherein an intermediate portion of the channel between the first end portion and the second end portion is formed as the same semiconductor material as the first end portion.

3. The method of claim 1, wherein the nonvolatile memory device further comprises a selection transistor folined between the plurality of memory cells and the source region, and wherein a pass voltage for transferring a voltage applied to the source region to the channel is applied to a gate of the selection transistor.

4. The method of claim 1, wherein the second end portion of the channel that adjoins the bit line and an intermediate portion of the channel between the first end portion and the second end portion are formed as the same semiconductor material as the first end portion, and wherein voltages applied to the bit line and the source region are the same.

5. The method of claim 4, wherein the nonvolatile memory device further comprises a first selection transistor formed between a plurality of memory cells and the source region; and a second selection transistor formed between the plurality of memory cells and the bit line, wherein a pass voltage for transferring the voltage applied to the bit line to the channel is applied to a gate of the second selection transistor, and a pass voltage for transferring the voltage applied to the source region to the channel is applied to a gate of the first selection transistor.

* * * * *